United States Patent
Koyama et al.

(10) Patent No.: US 7,271,411 B2
(45) Date of Patent: Sep. 18, 2007

(54) LIGHT EMITTING DEVICE AND MANUFACTURING METHOD OF THE SAME

(75) Inventors: Jun Koyama, Sagamihara (JP); Hiroyuki Miyake, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 184 days.

(21) Appl. No.: 10/848,144

(22) Filed: May 19, 2004

(65) Prior Publication Data

US 2004/0232418 A1  Nov. 25, 2004

(30) Foreign Application Priority Data

May 21, 2003  (JP)  .............................. 2003-144190

(51) Int. Cl.
*H01L 29/04* (2006.01)

(52) U.S. Cl. ..................... 257/59; 257/72; 257/E27.132

(58) Field of Classification Search .................. 257/59, 257/72, 83, 626, 639, 640, 649, E33.064, 257/E27.132; 349/61, 69, 122, 149–152
See application file for complete search history.

(56) References Cited

U.S. PATENT DOCUMENTS

| | | | | |
|---|---|---|---|---|
| 6,535,535 B1 * | 3/2003 | Yamazaki et al. | ....... | 372/43.01 |
| 6,664,145 B1 * | 12/2003 | Yamazaki et al. | .......... | 438/149 |
| 6,664,732 B2 | 12/2003 | Yamazaki et al. | | |
| 6,689,492 B1 | 2/2004 | Yamazaki et al. | | |
| 6,781,746 B2 | 8/2004 | Yamazaki et al. | | |
| 6,822,264 B2 | 11/2004 | Yamazaki et al. | | |
| 6,849,877 B2 | 2/2005 | Yamazaki et al. | | |
| 6,903,377 B2 | 6/2005 | Yamazaki et al. | | |
| 6,960,786 B2 | 11/2005 | Yamazaki et al. | | |
| 6,995,753 B2 * | 2/2006 | Yamazaki et al. | .......... | 345/204 |
| 7,005,671 B2 | 2/2006 | Yamazaki et al. | | |
| 7,042,024 B2 | 5/2006 | Yamazaki et al. | | |
| 2003/0027369 A1 | 2/2003 | Yamazaki | | |
| 2003/0091871 A1 | 5/2003 | Yamazaki et al. | | |
| 2004/0004214 A1 | 1/2004 | Yamazaki et al. | | |
| 2004/0061118 A1 | 4/2004 | Yamazaki et al. | | |
| 2004/0080263 A1 | 4/2004 | Yamazaki et al. | | |
| 2005/0007330 A1 | 1/2005 | Miyata et al. | | |

FOREIGN PATENT DOCUMENTS

JP    2001-203076    7/2001

* cited by examiner

*Primary Examiner*—Minh-Loan Tran
(74) *Attorney, Agent, or Firm*—Eric J. Robinson; Robinson Intellectual Property Law Office, P.C.

(57) ABSTRACT

The invention provides a downsized structure of a light emitting device, and a light emitting device which has enough reliability as a downsized light emitting device. The light emitting device comprising light emitting elements according to the invention includes a signal processing circuit disposed beside an FPC and the like that tended to be the dead space conventionally. Also, the light emitting device has a sealed structure using a barrier film in which moisture and oxygen can be blocked from outside not to come into TFTs, wirings, and the light emitting elements formed over a substrate.

9 Claims, 11 Drawing Sheets

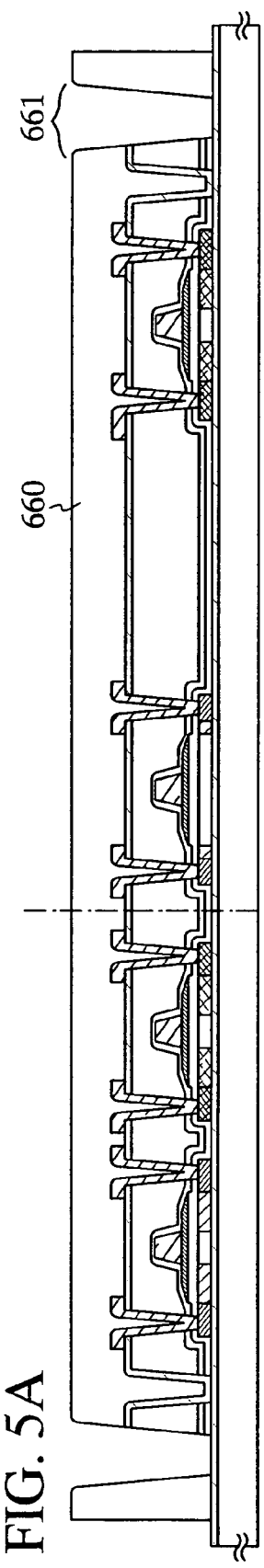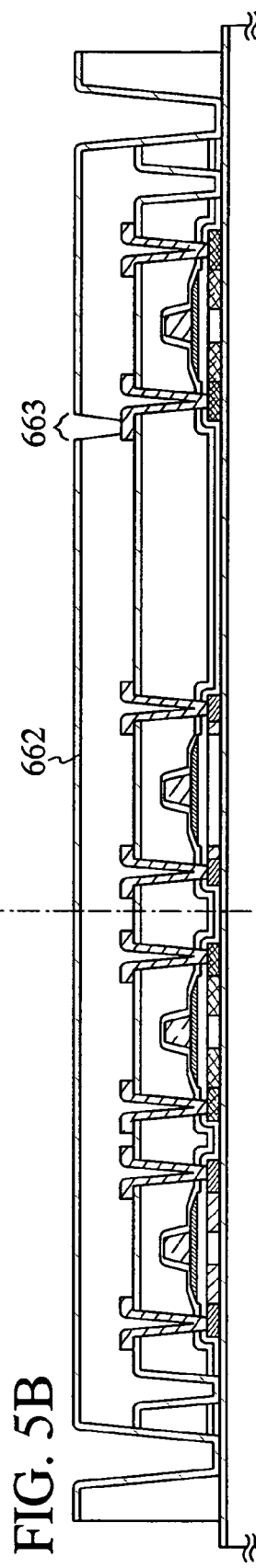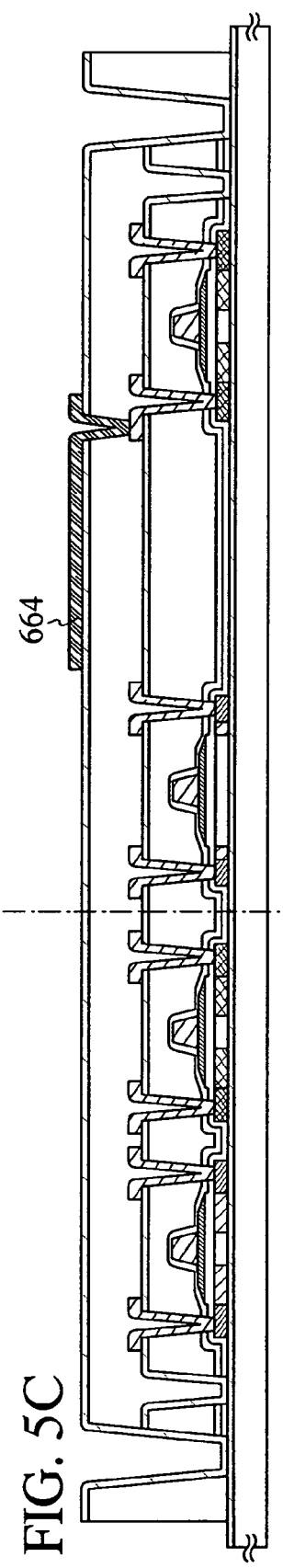

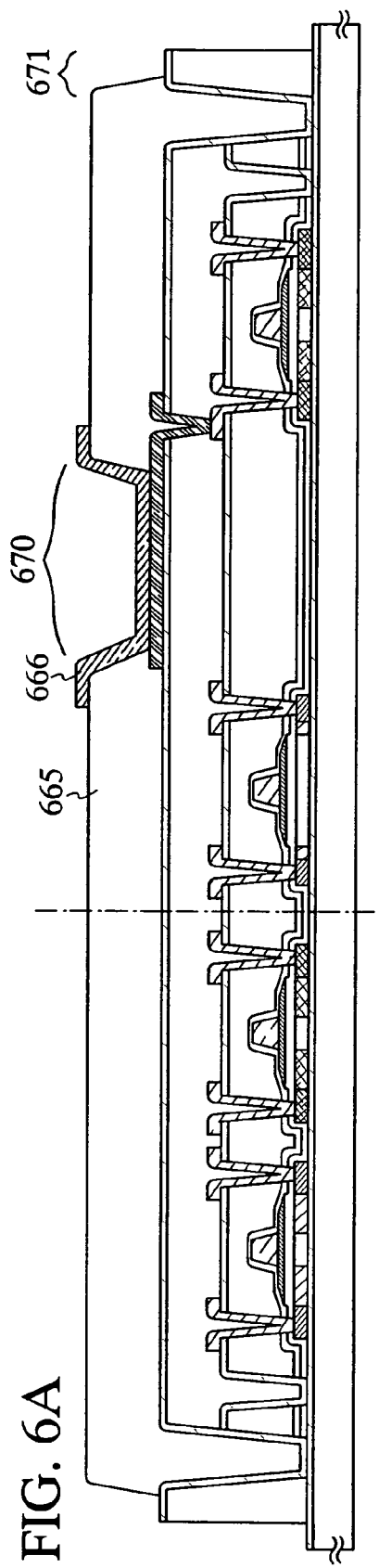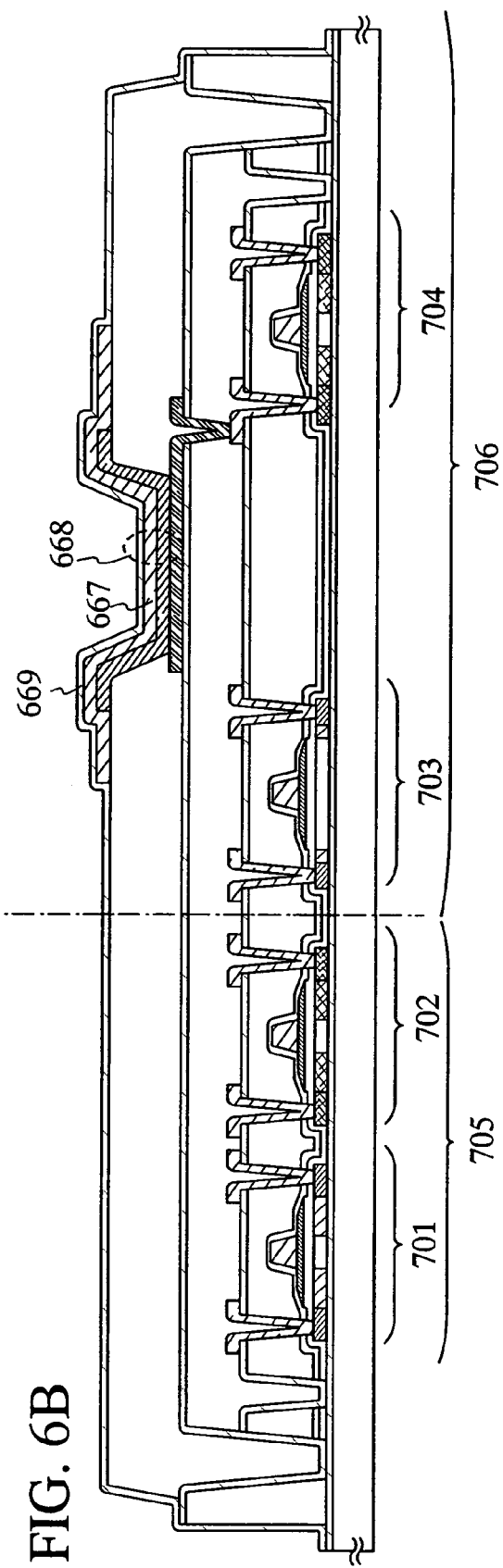
FIG. 6A
FIG. 6B

PRIOR ART

LIGHT EMITTING DEVICE AND MANUFACTURING METHOD OF THE SAME

BACKGROUND OF THE INVENTION

1. Field of the Invention

The present invention relates to a light emitting device comprising light emitting elements each including a pair of electrodes and a light emitting layer sandwiched between them, and a manufacturing method of the same. More particularly, the invention relates to a circuit configuration and a sealed structure of the light emitting device.

2. Description of the Related Art

In recent years, display panels using light emitting elements are actively developed. A light emitting element comprises a pair of electrodes (anode and cathode) and a light emitting layer sandwiched between them. The light emitting layer emits light when a voltage is applied to both electrodes. Since a display panel using the light emitting elements emits light in its light emitting layer sandwiched between both electrodes, further downsizing and thinner shape of the display panel are expected to be achieved.

As an obstruction to the downsizing and thinner shape of a display panel, an external circuit is noted. When forming a circuit externally, it becomes difficult to achieve the downsizing and thinner shape of a display panel since a wiring such as an FPC (Flexible Printed Circuit) for connecting the circuit to a substrate over which a pixel portion is formed is required as well as the mounting of the circuit.

It had been difficult to integrally form a signal line driver circuit, a signal processing circuit, and the like on the same substrate with a pixel portion by using conventional TFTs (Thin Film Transistors) formed of amorphous silicon since it has low mobility. However, at present, a semiconductor layer having high mobility can be formed by using low-temperature silicon at a relatively low temperature, thus it is possible to integrally form these circuits and the pixel portion on the same substrate. For example, as shown in FIG. 9, signal line driver circuits 901 and 902, and a signal processing circuit 903 are all formed on a substrate 905 which is connected to an FPC 904. Reference numeral 907 denotes a sealant and 908 denotes a sealing substrate to seal a light emitting element off. By integrally forming these circuits and a pixel portion 906 on the same substrate in this manner, no external component is required, which realizes the further downsizing and thinner shape of a display panel.

It is needless to say that the display panel using light emitting elements is expected to be applied to a mobile terminal by virtue of the expected compact size and thinness. However, as for a display panel for a mobile terminal, it is supposed to undergo a difficult condition as compared to a stationary display panel regarding the case of the outside use in wet weather, danger of a drop, and the like. Therefore, the downsized and thinner display device is required to have a high reliability enough to prevent the deterioration or breakdown even under such a difficult condition.

However, the light emitting element is easily deteriorated by moisture, oxygen, and the like as its light emitting layer comprises an organic material or an organic material partially including an inorganic material, which may generate a dark spot or shrink.

In order to prevent such a problem, there is a method in which light emitting elements formed on an insulator are sealed hermetically with a sealant and a covering material each formed around the light emitting elements, and a filling material such as a resin is provided around the sealed space and the covering material, thereby blocking out oxygen and moisture (see Patent Document 1 for example).

[Patent Document 1]

Japanese Patent Laid-Open No. Hei 13-203076

However, even by adopting such a method, the reliability which is required for the downsized and thinner display panel has not yet been secured enough so far.

SUMMARY OF THE INVENTION

In view of the foregoing problem, the invention provides a downsized structure of a light emitting device, and a light emitting device which can satisfy the reliability required for the downsized structure.

The invention provides a light emitting device comprising light emitting elements, wherein TFTs, wirings, and the light emitting elements each formed on a substrate are covered with a barrier film having a function to block out moisture and oxygen, and at least a part of a signal processing circuit which is formed by using thin film elements and a wiring connected portion such as an FPC are located beside a same edge of the substrate.

The invention provides a structure of a light emitting device comprising light emitting elements which are covered with a barrier film on a substrate, wherein a wiring connected portion is disposed on the substrate, and the wiring connected portion and at least a part of a signal processing circuit which is formed by using thin film elements are disposed beside a same edge of the substrate.

According to the aforementioned structure, moisture and oxygen are blocked from outside by the barrier film, which contributes greatly to the enhancement in reliability. Also, by utilizing the region beside the wiring connected portion which tended to be the dead space conventionally, a frame region of the light emitting device can be narrowed, leading to the downsizing of the light emitting device, thus it can suitably be applied to a mobile terminal. Further, by disposing the signal processing circuit outside the barrier film, the number of wirings which come across the sealed portion can be reduced. Therefore, the amount of moisture and oxygen which come in from the boundary between the wirings and the barrier film can be reduced, which can further enhance the reliability.

The invention provides a structure of a light emitting device comprising a wiring connected potion formed on a substrate, a first barrier film formed on the substrate, a TFT forming layer formed on the first barrier film, a second barrier film formed on the TFT forming layer, a wiring forming layer formed on the second barrier film, a third barrier film formed on the wiring forming layer, a light emitting element forming layer formed on the third barrier film, and a fourth barrier film formed on the light emitting element forming layer, wherein the second barrier film is in contact with the first barrier film in a first opening formed in a part of the TFT forming layer, at least a part of a signal processing circuit formed by using thin film elements and the wiring connected portion are formed beside a same edge of the substrate, and the signal processing circuit is formed in the exterior of the area in which the second barrier film is in contact with the first barrier film on the substrate.

According to the aforementioned structure, the second barrier film can be formed to be in contact with the first barrier film by forming it after forming the first opening, thus moisture and oxygen can be blocked from outside not to come into the TFT forming layer including a TFT. Furthermore, since the second barrier film which is formed in the first opening is formed in the vertical direction relatively to the substrate surface (horizontal direction), the structure is quite effective to block out moisture or oxygen from the horizontal direction. In addition, by utilizing the region beside the wiring connected portion which tended to be the dead space conventionally, a frame region of a light emitting device can be narrowed, leading to the downsizing of the device, thus it can suitably be applied to a mobile terminal. Further, by providing the signal processing circuit outside the barrier film, the number of wirings which come across the sealed portion in which the first barrier film is in contact with the second barrier film can be reduced. Therefore, the amount of moisture and oxygen which come in from the boundary between the wirings and the barrier film can be reduced, which can further enhance the reliability.

Also, according to the aforementioned structure, the third barrier film is in contact with each of the first barrier film and the second barrier film in a second opening which is a part of the wiring forming layer formed on the laminate of the TFT forming layer, and the wiring forming layer, the TFT forming layer is provided in the space between the first barrier film and the second barrier film, and the signal processing circuit is formed in the exterior of the areas in which the third barrier film is in contact with the first barrier film and the third barrier film is in contact with the second barrier film on the substrate.

According to the aforementioned structure, the third barrier film can be formed to be in contact with the second barrier film as well as the first barrier film by forming the third barrier film after forming the second opening. Therefore, moisture and oxygen can be blocked from outside not to come into the wiring forming layer in which the wiring for electrically connecting the TFT to the light emitting element is formed. Furthermore, since the third barrier film which is formed in the second opening is formed in the vertical direction relatively to the substrate (horizontal direction), the aforementioned structure is quite effective to block out moisture or oxygen from the horizontal direction.

According to each of the aforementioned structures, the fourth barrier film is in contact with the third barrier film, and the light emitting element forming layer is sandwiched between the third barrier film and the fourth barrier film, and formed in the exterior of the area in which the fourth barrier film is in contact with the third barrier film on the substrate.

Another structure of a light emitting device of the invention comprises a wiring connecting portion formed on a substrate, a first barrier film formed on the substrate, a TFT forming layer formed on the first barrier film, a second barrier film formed on the TFT forming layer, a wiring forming layer formed on the second barrier film, a third barrier film formed on the wiring forming layer, a light emitting element forming layer formed on the third barrier film, and a fourth barrier film formed on the light emitting element forming layer, wherein the TFT forming layer is covered with each of the first barrier film and the second barrier film, at least a part of a signal processing circuit which is formed by using thin film elements and the wiring connected portion are formed beside a same edge of the substrate, and the signal processing circuit is formed in the exterior of the area in which the second barrier film is in contact with the first barrier film on the substrate.

According to the aforementioned structure, the wiring forming layer is covered with each of the second barrier film and the third barrier film, the light emitting element forming layer is covered with each of the third barrier film and the fourth barrier film, and the signal processing circuit is formed in the exterior of the areas in which the third barrier film is in contact with the second barrier film and the fourth barrier film is in contact with the third barrier film on the substrate.

According to the invention, each of the first barrier film, the second barrier film, the third barrier film, and the fourth barrier film includes one or more of a silicon nitride film, a silicon nitride oxide film, and a nitrogen containing carbon film. In addition, the aforementioned films are desirably formed by sputtering.

According to the invention, moisture and oxygen can be blocked from outside by a barrier film, which contributes greatly to enhance the reliability of light emitting elements. Also, by utilizing the region beside the wiring connected portion which tended to be the dead space conventionally, a frame region of a light emitting device can be narrowed, leading to the downsizing of the device, thus it can suitably be applied to a mobile terminal. Further, by disposing a signal processing circuit outside a barrier film, the number of wirings which come across the sealed portion can be reduced. Therefore, the amount of moisture and oxygen which come in from the boundary between the wirings and the barrier film can be reduced, which can further enhance the reliability.

BRIEF DESCRIPTION OF THE DRAWINGS

FIGS. 5A to 5C are diagrams each showing Embodiment 4.

FIGS. 6A and 6B are diagrams each showing Embodiment 4.

DETAILED DESCRIPTION OF THE INVENTION

EMBODIMENT MODE

Figure 1A:
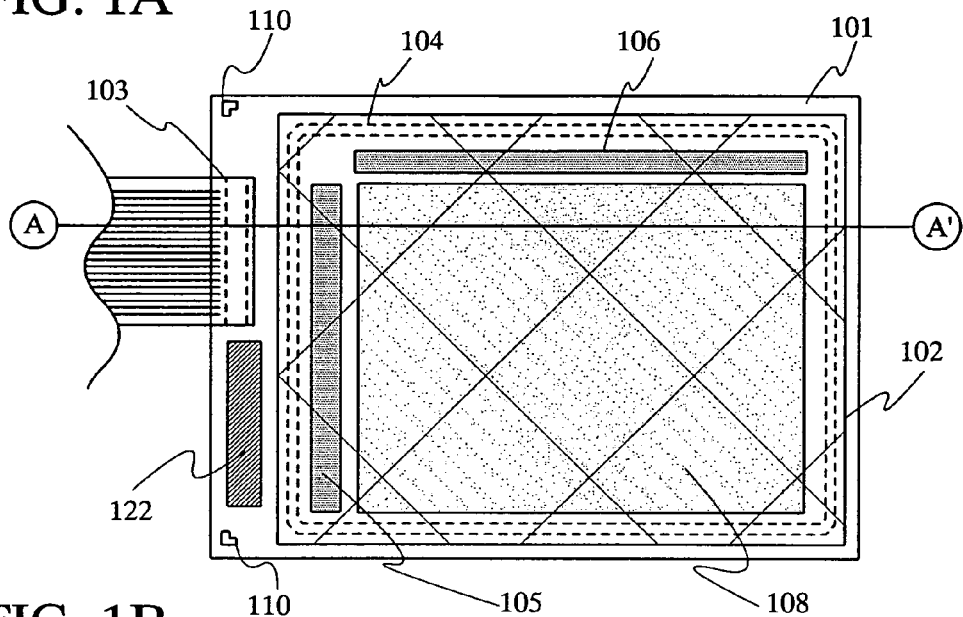
FIGS. 1A to 1C are diagrams each showing embodiment mode.
Figure 1B:
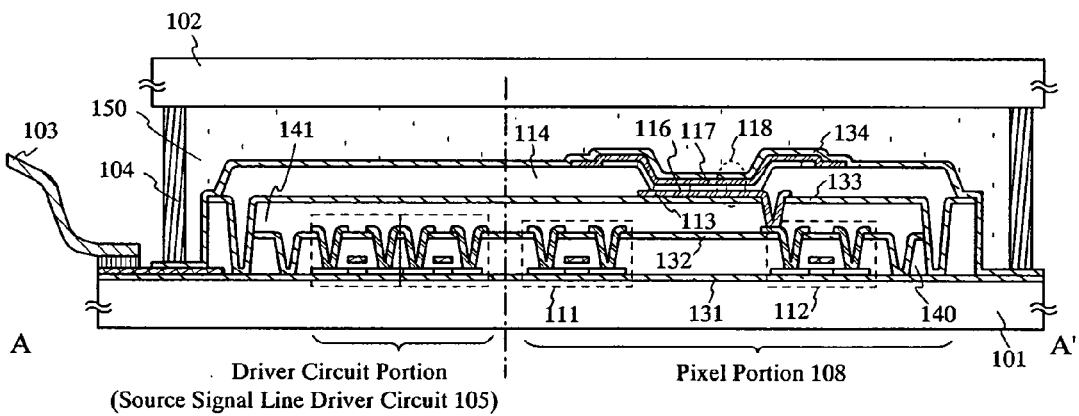
Figure 1C:
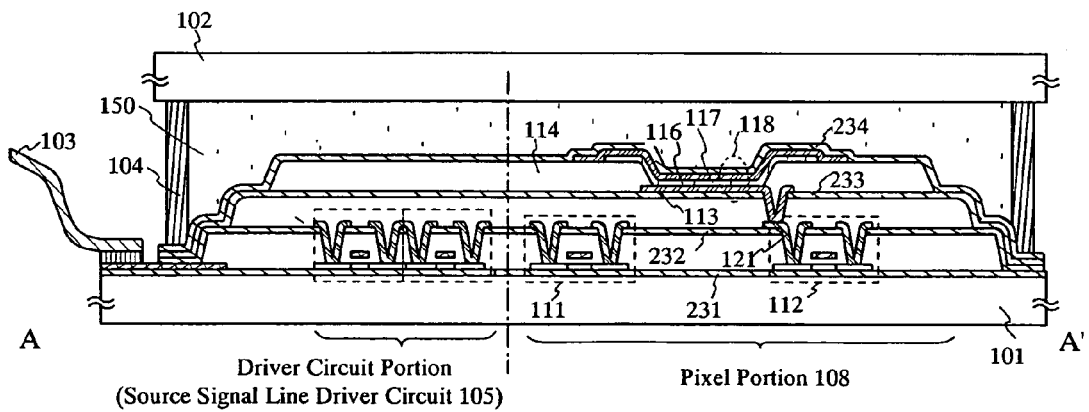

FIG. 1A shows a top view of a light emitting device of the invention. According to the present embodiment mode, the light emitting device comprises an insulating substrate 101 which is mounted with a pixel portion 108 comprising TFTs and light emitting elements, a source signal line driver circuit 105, a gate signal line driver circuit 106, a first sealant 104, and a sealing substrate 102 as shown in FIGS. 1A to 1C. Electric signals for driving the light emitting device are input from a wiring 103, and beside a wiring connected portion, alignment mark 110 is disposed.

The light emitting device is different from the conventional ones in that a signal processing circuit 122 is disposed outside a sealant, and disposed in the region beside the region where the wiring connected portion is formed in the direction where there is no pixel portion, namely beside the wiring connected portion (that is, beside a same edge of the substrate) in this embodiment mode.

The signal processing circuit according to the invention includes a variety of circuits such as audio signal processing circuit, image signal processing circuit, controller circuit, CPU, and memory circuit.

FIG. 1B shows a cross-sectional view of a barrier film structure of the invention cut along the line A-A' in FIG. 1A. A first barrier film 131 is deposited on the substrate 101, and a driver circuit portion and a pixel portion are formed thereon by using TFTs (Thin Film Transistors). The source signal line driver circuit 105 as a driver circuit portion and the pixel portion 108 are shown here.

Then, on a first interlayer insulating film 140 covering these TFTs, a second barrier film 132 is deposited. The second barrier film 132 is formed so as to cover an opening reaching the first barrier film 131 which is provided near the end portion of the first interlayer insulating film 140. At the bottom of the opening, the first barrier film 131 and the second barrier film 132 are in contact with each other.

On the second barrier film 132, a second interlayer insulating film 141 is deposited so as to cover a wiring which is electrically connected to a source region or a drain region of the TFT, and a third barrier film 133 is deposited thereon. The third barrier film 133 is formed so as to cover an opening reaching the first barrier film 131 which is provided at the end portion of the second interlayer insulating film 141. At the bottom of the opening, the first barrier film 131 and the third barrier film 133 are in contact with each other.

The pixel portion 108 comprises a plurality of pixels each including a switching TFT 111, a current controlling TFT 112, and a first electrode 113 which is electrically connected to a drain of the current controlling TFT 112. Further, an insulator 114 is formed so as to cover an end portion of the first electrode 113 which is formed on the third barrier film 133.

On the first electrode 113, a light emitting layer 116 and a second electrode 117 are deposited in this order to form a light emitting element 118. According to the present embodiment mode, the first electrode 113 functions as an anode and the second electrode 117 functions as a cathode. Further, a fourth barrier film 134 is formed so as to cover the second electrode 117 and the insulator 114.

By attaching the sealing substrate 102 to the substrate (element substrate) 101 with the first sealant 104 and a second sealant 150, a sealed structure is completed by which a light emitting element 118 is provided inside the light emitting device.

Now, another sealed structure of the light emitting device of the invention is described with reference to FIG. 1C. FIG. 1C also shows a cross-sectional view of a barrier film structure cut along the line A-A' in FIG. 1A.

According to the structure shown in FIG. 1C, the structure of a TFT which is formed on a substrate and the structure of a light emitting element which is electrically connected to the TFT are similar to those shown in FIG. 1B, therefore, description on the same components as in FIG. 1B are omitted herein.

According to the structure shown in FIG. 1C, a first barrier film 231 and a second barrier film 232 are formed to be in contact with each other around a TFT forming layer, therefore, the structure of completely covering the TFT forming layer is achieved. In addition, since the second barrier film 232 and a third barrier film 233 are formed to be in contact with each other around a wiring forming layer, the structure of completely covering the wiring forming layer is achieved. In addition, since the third barrier film 233 and a fourth barrier film 234 are formed to be in contact with each other around a light emitting element forming layer, the structure of completely covering the light emitting element forming layer is achieved. Thus, moisture and oxygen are blocked from outside (in the horizontal direction in particular) not to come into these layers.

As described above, by disposing the signal processing circuit in the region beside the region where the wiring connected portion is formed in the direction where no pixel portion is formed, the substrate area within the first sealant 104 can be reduced, which contributes to the downsizing of the light emitting device. Also, by providing the aforementioned barrier films in the downsized light emitting device, these layers can be prevented from being exposed to moisture and oxygen from outside (in the horizontal direction in particular), which can greatly enhance the reliability. Thus, it can suitably be applied to a display panel of a mobile terminal. In addition, by providing the signal processing circuit outside the sealant and the sealed portion, the wirings which are connected to the signal processing circuit are prevented from coming across the sealant and the sealed portion, which makes it possible to reduce moisture and oxygen coming in from outside of the contact portion between the barrier films and the wiring, leading to the further enhanced reliability.

Embodiment 1

Figure 7:
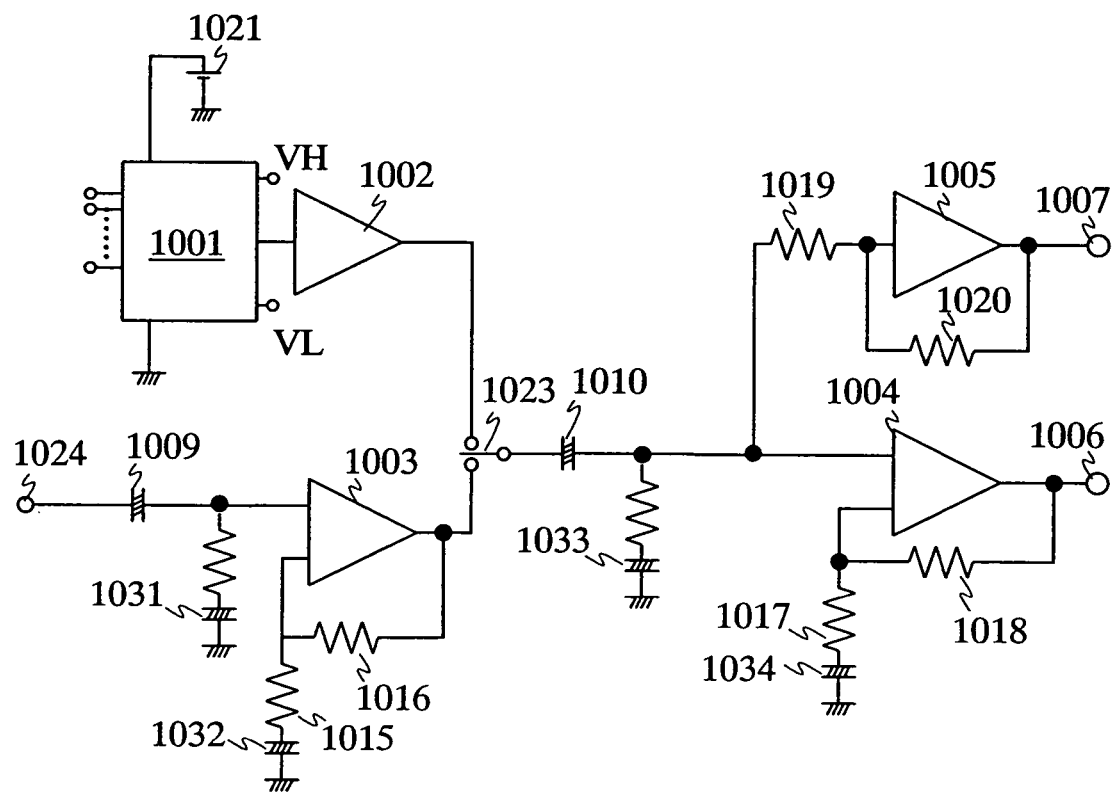
FIG. 7 is a diagram showing Embodiment 1.

FIG. 7 shows an audio signal processing circuit as an example of the signal processing circuit according to the invention. Shown here is a connection between a D/A converter circuit and a speaker-driving terminals. The audio signal processing circuit includes a D/A converter circuit 1001, a D/A converter buffer circuit 1002, a preamplifier 1003, a non-inverting amplifier for driving speaker 1004, an inverting amplifier for driving speaker 1005, speaker-driving terminals 1006 and 1007, a coupling capacitors 1009 and 1010, smoothing capacitors 1031, 1032, 1033, and 1034, a preamplifier feedback resistor 1016, gain setting resistors for driving speaker 1017 to 1020, a power supply for D/A converter circuit 1021, an analog-to-digital switch 1023, and an analog signal input terminal 1024.

The operation thereof is described now. A parallel digital audio signal is converted to an analog signal in the D/A converter circuit 1001, and then input to the analog-to-digital switch 1023 through the D/A converter buffer circuit 1002. Meanwhile, an analog audio signal is input from the analog signal input terminal 1024 to the preamplifier 1003 through the coupling capacitor 1009. A gain of the preamplifier 1003 is determined according to the resistance ratio of the preamplifier feedback resistor 1016 and the resistor 1015. Then, an output signal from the preamplifier 1003 is input to the analog-to-digital switch 1023. The analog-to-digital switch 1023 selects either the output signal from the D/A converter circuit or the analog input signal. The selected signal is input to the non-inverting amplifier for driving speaker 1004 or to the inverting amplifier for driving speaker 1005 through the coupling capacitor 1010. Then, after being amplified, it is output to the speaker-driving terminals 1006 and 1007.

By forming a signal processing circuit typified by the above-described audio signal processing circuit beside a same edge of the substrate as the wiring connected portion, the number of external components can be reduced, which contributes to the downsizing and improvement in reliability of a light emitting device. Further, since a frame region of the light emitting device can be narrowed down, the further downsizing can be achieved.

Embodiment 2

Figure 2A:
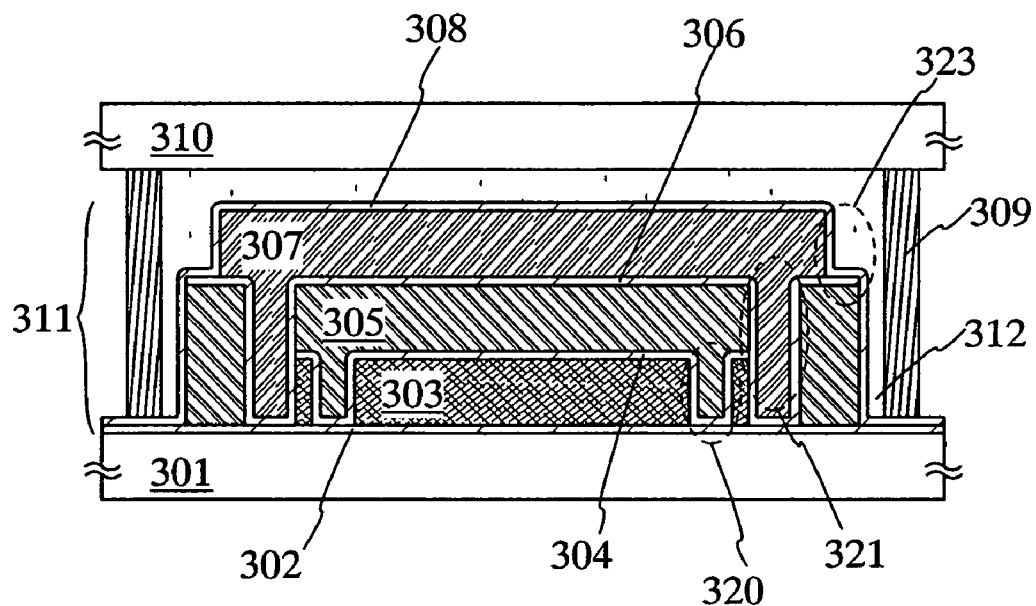
FIGS. 2A and 2B are diagrams each showing Embodiment 2.
Figure 2B:
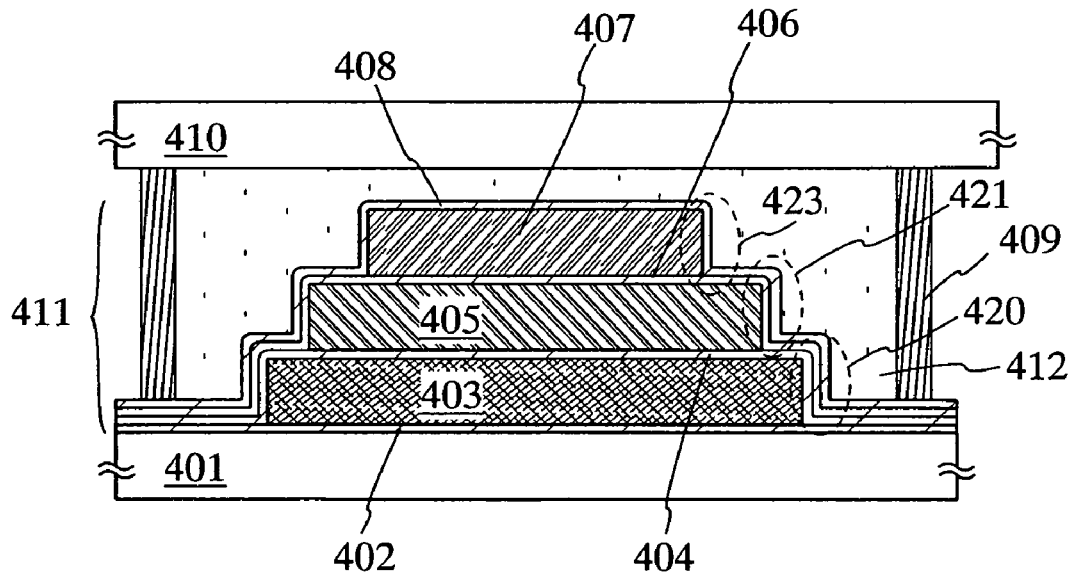

An embodiment of the invention is described now with reference to FIG. 2. FIGS. 2A and 2B each show a sealed structure of a light emitting device according to the invention.

In FIG. 2A, a first barrier film 302 is deposited over a substrate 301. The first barrier film 302 may include one or more of a silicon nitride film, a silicon nitride oxide film, and a nitrogen containing carbon film, and be formed to have a thickness of 50 nm to 500 nm by sputtering, CVD, and the like.

On the first barrier film 302, a TFT forming layer 303 in which a plurality of TFTs (Thin Film Transistors) are covered with an interlayer insulating film is formed. It is to be noted that TFT herein defined is any TFT formed by known methods and having known structures, therefore, the invention is not limited to a specific TFT. A part of the TFT forming layer 303 is formed with a first opening 320 that penetrates the TFT forming layer 303. The TFT forming layer 303 and the first opening 320 (including an exposed side face of the TFT forming layer 303) are covered with a second barrier film 304. The second barrier film 304 may include one or more of a silicon nitride film, a silicon nitride oxide film, and a nitrogen containing carbon film, and be formed to have a thickness of 50 nm to 500 nm by sputtering, CVD, and the like.

Next, a wiring forming layer 305 is deposited on the second barrier film 304. The wiring forming layer 305 includes an insulating film formed with an insulating material. In a part of the insulating film, a wiring is formed with a conductive material. Through the wiring forming layer 305, the second barrier film 304, and the TFT forming layer 303, a second opening 321 is formed to penetrate each of them. The wiring forming layer 305 and the second opening 321 (including exposed side faces of the wiring forming layer 305, the second barrier film 304, and the TFT forming layer 303) are covered with a third barrier film 306. The third barrier film 306 may include one or more of a silicon nitride film, a silicon nitride oxide film, and a nitrogen containing carbon film, and be formed to have a thickness of 50 nm to 500 nm by sputtering, CVD, and the like.

Next, a light emitting element forming layer 307 including a light emitting element is deposited on the third barrier film 306. It is to be noted a light emitting element includes a pair of electrodes and a light emitting layer sandwiched between them.

The light emitting element formed in the light emitting element forming layer 307 is electrically connected to a part of the TFT formed in the TFT forming layer 303 through the wiring formed in the wiring forming layer 305. It is to be noted that one electrode of the light emitting element that is connected to the TFT is referred to as a first electrode, and the other electrode that is formed on the first electrode to sandwich the light emitting layer is referred to as a second electrode. According to the invention, either the first or second electrode may be an anode or a cathode, and either or both of the first and second electrodes may be capable of transmitting light.

As for the anodic material for forming an anode, it is preferable to use a material having a large work function (4.0 eV or more) such as a metal, an alloy, an electrically conductive compound, or a mixture of them. Specifically, indium tin oxide (ITO), indium zinc oxide (IZO) in which 2% to 20% of zinc oxide (ZnO) is mixed with indium oxide, gold (Au), platinum (Pt), nickel (Ni), tungsten (W), chromium (Cr), molybdenum (Mo), iron (Fe), cobalt (Co), copper (Cu), palladium (Pd), nitride metal materials (TiN), and the like can be used.

As for the cathodic material for forming a cathode, it is preferable to use a material having a small work function (3.8 eV or less) such as a metal, an alloy, an electrically conductive compound, or a mixture of them. For example, elements that belong to the first group or the second group of a periodic table, namely alkaline metals such as Li and Cs, and alkaline earth metals such as Mg, Ca and Sr, alloys including these elements (Mg:Ag, Al:Li), chemical compounds including these elements (LiF, CsF, $CaF_2$) and in addition, transition metals including rare earth metals can be used. A laminate of a metal such as Al, Ag, or ITO (including alloys) may also be used.

It is to be noted that the anode and the cathode may be deposited using the anodic material and the cathodic material described above by vapor deposition, sputtering, and the like, and it is preferable to form the anode and cathode to have a thickness of 10 nm to 500 nm each.

According to the invention, known materials can be used for a light emitting layer, and either a low molecular weight organic material or a high molecular weight organic material may be used. Further, not only an organic compound material but an inorganic material can be used as a part of the light emitting layer.

It is to be noted that the structure of the light emitting element according to the invention may be as follows: 1) anode/light emitting layer/cathode, 2) anode/hole transporting layer/light emitting layer/cathode, 3) anode/hole transporting layer/light emitting layer/electron transporting layer/cathode, 4) anode/hole injection layer/hole transporting layer/light emitting layer/electron transporting layer/cathode, 5) anode/hole injection layer/hole transporting layer/light emitting layer/electron transporting/electron injection layer/cathode, 6) anode/hole injection layer/hole transporting layer/light emitting layer/hole blocking layer/electron transporting layer/cathode, 7) anode/hole injection layer/hole transporting layer/light emitting layer/hole blocking layer/electron transporting layer/electron injection layer/cathode, and the like.

The light emitting element forming layer 307 shown in this embodiment is formed small so as not to be wholly overlapped with the third barrier film 306. That is, the third barrier film 306 is still exposed to the surface partially even after the light emitting element forming layer 307 is formed. Therefore, the third barrier film 306 is exposed around the light emitting element forming layer 307 when an element forming layer 311 is seen from the sealing substrate 310 side shown in FIG. 2A.

Next, a fourth barrier film 308 is deposited. The fourth barrier film 308 is formed to be in contact with the third barrier film 306 in an area 323 shown in FIG. 2A. According to such a structure, the light emitting element forming layer 307 can be formed to be completely covered with the third barrier film 306 and the fourth barrier film 308. The fourth barrier film 308 may include one or more of a silicon nitride film, a silicon nitride oxide film, and a nitrogen containing carbon film, and be formed to have a thickness of 50 nm to 3 μm by sputtering, CVD, and the like.

Accordingly, the element forming layer 311 including the first barrier film 302, the TFT forming layer 303, the second barrier film 304, the wiring forming layer 305, the third barrier film 306, the light emitting element forming layer 307, and the fourth barrier film 308 can be formed on the substrate 301. Thus, moisture and oxygen can be blocked from outside not to come into the element forming layer 311.

Next, a sealant is formed on the element forming layer 311. In this embodiment mode, a first sealant 309 is formed in an area (outside) which is not overlapped with the element forming layer 311 over the substrate, and then a second sealant 312 is formed in an area (inside) which is covered with the first sealant 309 on the substrate.

It is to be noted that the first sealant 309 includes a gap material for keeping space between substrates (such as a filler and particles), and is preferably formed by a ultraviolet curing resin, a thermosetting resin or the like that having a higher viscosity than that of the second sealant 312. Specifically, an epoxy resin may be used for it. The second sealant 312 may preferably be formed by using an ultraviolet curing resin, a thermosetting resin, or the like having transmittancy, which is preferably dispersed with an ultraviolet absorbent inside. Specifically, an epoxy resin, or an acrylate (urethane acrylate) resin can be used.

Further, as an ultraviolet absorbent that is dissipated into the second sealant, a benzotriazole, benzophenone, or salicylate compound can be used.

As for the benzotriazole compound, the following can be used:
2-(5-methyl-2-hydroxyphenyl)benzotriazole,
2-[2-hydroxy-3,5-di(a,a-dimethylbenzyl)phenyl]-2H-benzotriazole,
2(3,5-di-tert-butyl-2-hydroxyphenyl)benzotriazole,
2-(3-tert-butyl-5-methyl-2-hydroxyphenyl)-5-chlorobenzotriazole,
2-(3,5-di-tert-butyl-2-hydroxyphenyl)-5-chlorobenzotriazole,
2-(3,5-di-tert-acyl-2-hydroxyphenyl)benzotriazole,
2-(2'-hydroxy-5'-tert-octylphenyl)-benzotriazole, and the like.

As for the benzophenone compound, the following can be used: 2,4-dihydroxybenzophenone, 2-hydroxy-4-methoxy benzophenone, 2-hydroxy-4-octyloxybenzophenone, 4-dodecyloxy-2-hydroxybenzophenone, 4-benzyloxy-2-hydroxybenzophenone, 2,2',4,4'-tetrahydroxybenzophenone, 2,2-dihydroxy-4,4'-dimethoxybenzophenone, and the like.

In addition, as for the salicylate compound, phenyl salicylate, 4-tert-butylphenyl salicylate, and the like can be used.

Further, a benzoate compound such as 2,4-di-tert-butylphenyl 3',5'-di-tert-butyl-4-hydroxybenzoate, and a triazine compound such as 2-[4-((2-hydroxy-3-dodecyloxypropyl)-oxy)2-hydroxy-phenyl]-4, 6-bis(2,4-dimethylphenyl)1, 3,5-triazine can also be used as an ultraviolet absorbent.

It is to be noted that according to the invention, the first sealant 309 is preferably provided to obtain a uniform sealed structure although it is dispensable.

As described above, the sealed structure shown in FIG. 2A is completed by attaching the sealing substrate 310 to the substrate 301 with the sealants.

In addition, as well as the sealed structure shown in FIG. 2A, a structure shown in FIG. 2B can be employed as well.

FIG. 2B is different from FIG. 2A in the shapes of a TFT forming layer 403, a wiring forming layer 405, and a light emitting element forming layer 407 which are all included in an element forming layer 411. Accordingly, shapes of a first barrier film 402, a second barrier film 404, a third barrier film 406, and a fourth barrier film 408 shown in FIG. 2B are all different from those shown in FIG. 2A. Each of the structures and materials used for a substrate 401, the TFT forming layer 403, the wiring forming layer 405, the light emitting element forming layer 407, the first barrier film 402, the second barrier film 404, the third barrier film 406, the fourth barrier film 408, a first sealant 409, a second sealant 412, and a sealing substrate 410 is similar to those of FIG. 2A, therefore, the description is omitted herein.

According to the structure shown in FIG. 2B, the first barrier film 402 and the second barrier film 404 can be formed to be in contact with each other in an area 420, thus it is possible to completely cover the TFT forming layer 403. In addition, since the second barrier film 404 and the third barrier film 406 are formed to be in contact with each other in an area 421, it is possible to completely cover the wiring forming layer 405. Further, since the third barrier film 406 and the fourth barrier film 408 are formed to be in contact with each other in an area 423, it is possible to completely cover the light emitting element forming layer 407, thus moisture and oxygen can be blocked from outside (in the horizontal direction in particular) not to come into these layers.

This embodiment can be freely combined with embodiment mode and Embodiment 1, which further enhances the reliability of a light emitting device, and accordingly, a light emitting device which is suitable for a display panel of a mobile terminal can be manufactured.

Embodiment 3

Figure 8A:
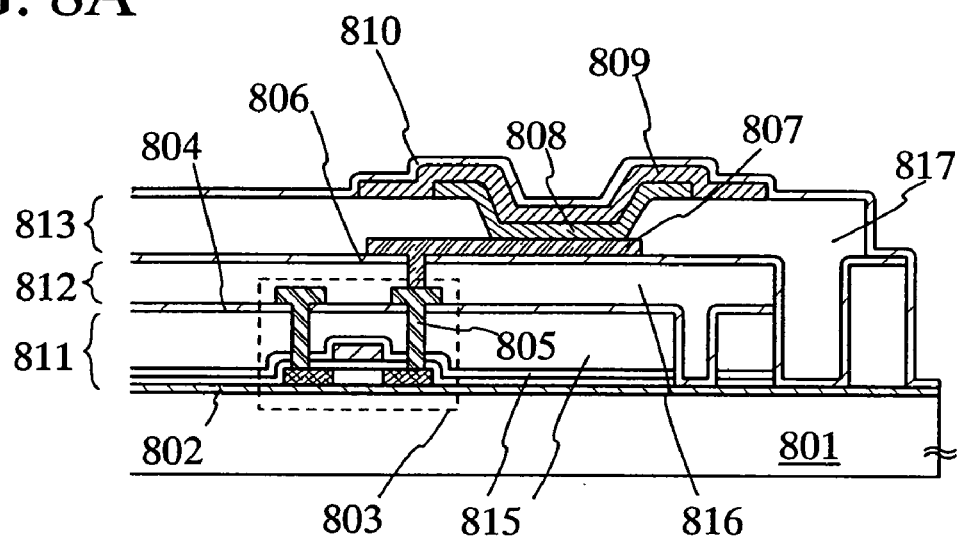
FIGS. 8A and 8B are diagrams each showing Embodiment 3.
Figure 8B:
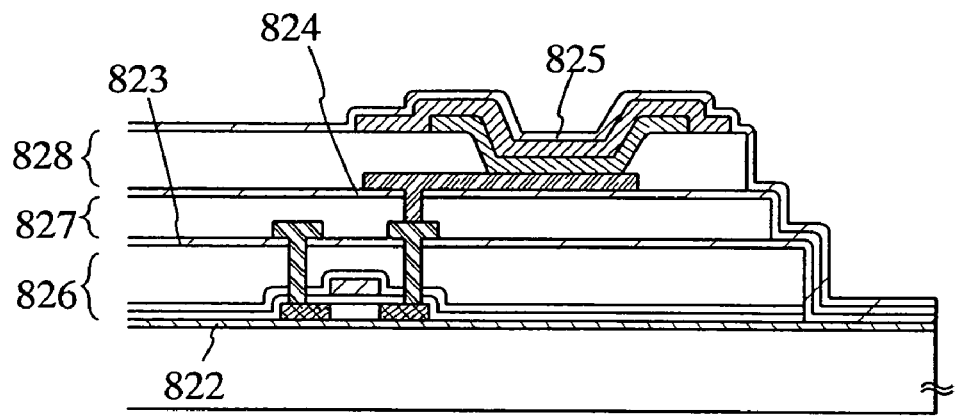
Figure 9:
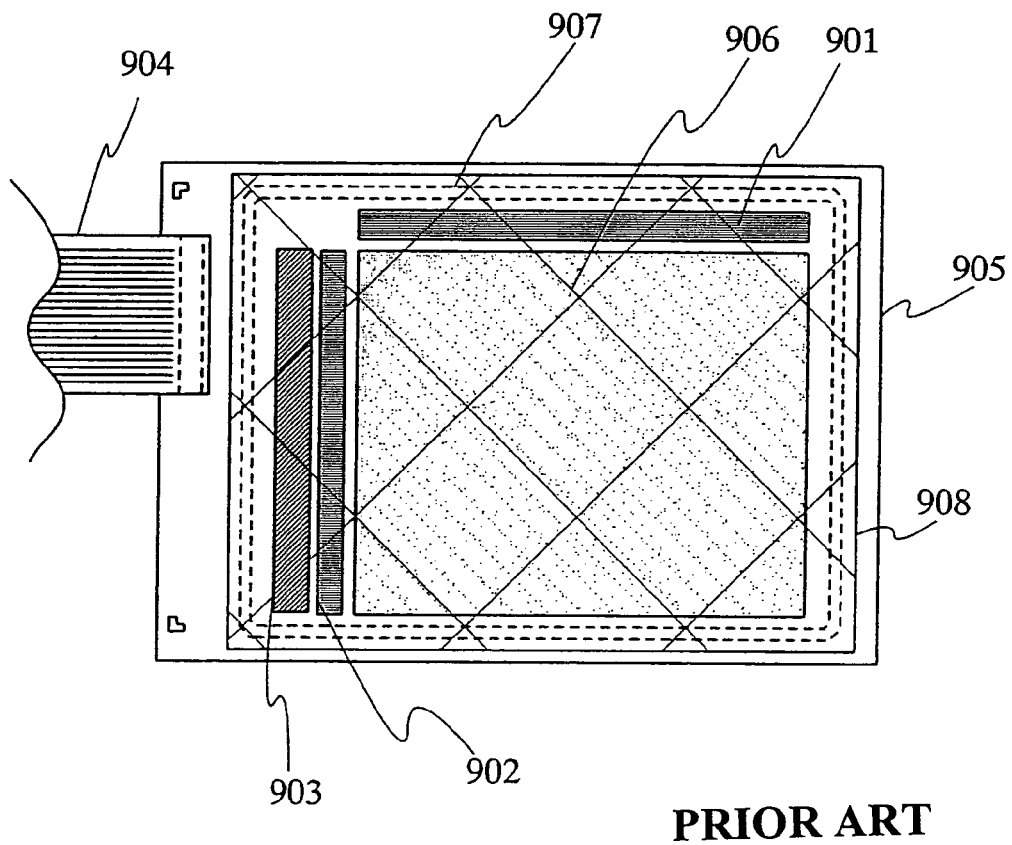
FIG. 9 is a diagram showing a conventional structure.

Described in this embodiment are a structure and a manufacturing method of a sealed portion with reference to FIGS. 8A and 8B.

FIG. 8A shows a preferred embodiment in the case where the structure shown in FIG. 2A is applied in Embodiment 2.

In FIG. 8A, a first barrier film 802 is deposited on a substrate 801. In this embodiment, a silicon nitride film is formed to have a thickness of 100 nm by sputtering.

Then, a TFT 803 is formed on the first barrier film 802. It is to be noted that the TFT 803 at least comprises impurity regions (source region and drain region), a channel forming region, a gate insulating film, and a gate electrode. A TFT forming layer 811 includes a plurality of TFTs. The TFT 803 shown in FIG. 8A denotes a TFT which is electrically connected to a first electrode of a light emitting element to be formed later (also referred to as a current controlling TFT). Then, a first interlayer insulating film 815 is deposited so as to cover the TFT 803. It is to be noted that the first interlayer insulating film 815 may have either a single-layer structure including an insulating material or a multi-layer structure including a plurality of insulating materials. As a specific insulating material, an inorganic material (silicon oxide, silicon nitride, silicon oxynitride, or the like), a photosensitive or non-photosensitive organic material (polyimide, acrylic, polyamide, polyimide amide, resist, benzocyclobutene, or SOG), or the like can be used. In this embodiment, the first interlayer insulating film 815 has a multi-layer structure including a silicon nitride film having a thickness of 100 nm as a first layer and an acrylic film having a thickness of 1.00 μm as a second layer. In this manner, the TFT forming layer 811 is completed.

Next, an opening is formed in a part of the TFT forming layer 811. Here, the opening is formed in each part of the first interlayer insulating film 815 and the gate insulating film.

Then, a second barrier film 804 is deposited on the TFT forming layer 811 including the opening. In this embodiment, a silicon nitride film is formed to have a thickness of 100 nm by sputtering. At this time, the TFT forming layer 811 can be covered with each of the first barrier film 802 and the second barrier film 804 since the second barrier film 804 is formed to be partially in contact with the first barrier film 802.

Next, after forming an opening in a part of the second barrier film 804, the first interlayer insulating film 815, and the gate insulating film so as to reach the impurity region of the TFT 803, a conductive film is deposited and patterned to form a wiring 805. As a wiring material, elements selected from the group including Ta, W, Ti, Mo, Al, Cu, or an alloy material or a compound material having one of these elements as its main component can be used. In this embodiment, a tantalum nitride film having a thickness of 30 nm and a tungsten film having a thickness of 370 nm are sequentially deposited in this order. Then, a second interlayer insulating film 816 is formed so as to cover the wiring 805. It is to be noted that the second interlayer insulating film 816 may have either a single-layer structure including an insulating material or a multi-layer structure including a plurality of insulating materials. As the specific insulating material, an inorganic material (silicon oxide, silicon nitride, silicon oxynitride, or the like), a photosensitive or non-photosensitive organic material (polyimide, acrylic, polyamide, polyimide amide, resist, benzocyclobutene, or SOG), or the like can be used. In this embodiment, the second interlayer insulating film 816 is formed to have a thickness of 1.00 μm by using acrylic. In this manner, the wiring forming layer 812 is completed.

Next, an opening is formed in a part of the wiring forming layer 812, the TFT forming layer 811, and the second barrier film 804. Here, the opening is formed in a part of the second interlayer insulating film 816, the second barrier film 804, the first interlayer insulating film 815, and the gate insulating film.

Then, a third barrier film 806 is deposited on the wiring forming layer 812 including the opening. In this embodiment, a silicon nitride film is formed to have a thickness of 100 nm by sputtering. At this time, the wiring forming layer 812 can be covered with each of the second barrier film 804 and the third barrier film 806 since the third barrier film 806 is formed to be partially in contact with the second barrier film 804.

Next, after forming an opening in a part of the third barrier film 806 and the second interlayer insulating film 816 so as to reach the wiring 805, a conductive film is deposited and patterned to form a first electrode 807. It is to be noted in this embodiment that the first electrode 807 is formed by using a transparent conductive film. Specifically, it is formed by using ITO to have a thickness of 110 nm by sputtering.

Then, an insulating layer (also referred to as a bank, barrier, partition wall, mound, and the like) 817 is formed so as to cover an edge of the first electrode 807. It is to be noted that the insulating layer 817 may have either a single-layer structure including an insulating material or a multi-layer structure formed including a plurality of insulating materials. As the insulating material, an inorganic material (silicon oxide, silicon nitride, silicon oxynitride or the like), a photosensitive or non-photosensitive organic material (polyimide, acrylic, polyamide, polyimide amide, resist, benzocyclobutene, or SOG), or the like can be used. In this embodiment, the insulating layer 817 is formed to have a thickness of 1.45 μm by using acrylic as a photosensitive organic resin.

The insulating layer 817 is formed small so as not to be wholly overlapped with the third barrier film 806. That is, the third barrier film 806 is still exposed to the surface partially even after the light emitting element forming layer 813 is formed.

Then, a light emitting layer 808 is deposited on the first electrode 807. The light emitting layer 808 may have either a single-layer structure including only a light emitting layer, or a multi-layer structure using a plurality of materials. It is to be noted in this embodiment mode that the light emitting layer 808 comprises a multi-layer structure formed by laminating Cu-Pc as a hole injection layer, a-NPD as a hole transporting layer, and Alq$_3$ as a light emitting layer.

Next, a second electrode 809 is deposited on the light emitting layer 808. It is to be noted that the second electrode 809 is formed by patterning a conductive film with a metal mask. In this embodiment, the second electrode 809 is a cathode, therefore, an alloy such as Mg:Ag, Mg:In, and Al:Li, CaF$_2$, CaN, or a conductive film fabricated by co-vapor deposition of an element that belongs to the first group or the second group of a periodic table and aluminum can be used to form the second electrode 809. In this embodiment, the second electrode 809 is required to transmit light. Therefore, the second electrode 809 is formed by using an aluminum film having a thickness of 1 nm to 10 nm, or an aluminum film including a slight amount of Li. In this case, a light-transmissive film including CaF$_2$, MgF$_2$, or BaF$_2$ (having a thickness from 1 nm to 5 nm) may be used as a cathode buffer layer before forming the aluminum film. In this manner, the light emitting element forming layer 813 is formed.

Then, a fourth barrier film 810 is deposited over the light emitting element forming layer 813. In this embodiment, a silicon nitride film is formed to have a thickness of 100 nm by sputtering.

At this time, the fourth barrier film 810 is formed to be partially in contact with the third barrier film 806, therefore, the light emitting element forming layer 813 can be formed to be covered with each of the third barrier film 806 and the fourth barrier film 810.

According to the above structure, a sealed structure is completed in which moisture and oxygen are blocked from outside (in the horizontal direction in particular) not to come into each of the TFT forming layer 811, the wiring forming layer 812, and the light emitting element forming layer 813 formed over the substrate.

FIG. 8B shows a preferred embodiment in the case where the stcructure shown in FIG. 2B is applied in Embodiment 2.

The structure shown in FIG. 8B is similar to FIG. 8A in the structure of a TFT formed over the substrate and a light emitting element which is electrically connected to TFT, but different in the structure of a TFT forming layer 826, a wiring forming layer 827, and a light emitting element forming layer 828, which means each of a second barrier film 823, a third barrier film 824, and a fourth barrier film 825 has a different shape from that of FIG. 8A.

Specifically, the wiring forming layer 827 is formed smaller than the TFT forming layer 826 formed over the substrate, and the second barrier film 823 that is formed on the TFT forming layer 826 is exposed around the wiring forming layer 827. Also, the light emitting element forming layer 828 is formed smaller than the wiring forming layer 827, and the third barrier film 824 that is formed on the wiring forming layer 827 is exposed around the light emitting element forming layer 828.

According to the structure shown in FIG. 8B, the first barrier film 822 and the second barrier film 823 are formed to be in contact with each other around the TFT forming layer 826, thus it is possible to completely cover the TFT forming layer 826 with them. In addition, since the second barrier film 823 and the third barrier film 824 are formed to be in contact with each other around the wiring forming layer 827, it is possible to completely cover the wiring forming layer 827 with them. Further, since the third barrier film 824 and the fourth barrier film 825 are formed to be in contact with each other around the light emitting element forming layer 828, it is possible to completely cover the light emitting element forming layer 828 with them, thus moisture and oxygen can be blocked from outside (in the horizontal direction in particular) not to come into these layers. This embodiment can be freely combined with embodiment mode and Embodiments 1 and 2, which serves for the further enhanced reliability of a light emitting device, and accordingly, a light emitting device which is suitable for a display panel of a mobile terminal can be manufactured.

Embodiment 4

Described in this embodiment are a structure of a light emitting device in which a pixel portion and a driver circuit comprising TFTs (both N-channel TFTs and P-channel TFTs) which is disposed around the pixel portion are formed over the same substrate, and a sealed structure thereof with reference to FIGS. 3A to 6B.

It is to be noted that a signal processing circuit is formed beside an FPC as shown in FIG. 1A described in Embodiment, and it may be formed concurrently with the TFT fabrication. In the case of forming a multi-layer wiring, additional steps may be adopted as needed.

Figure 3A:
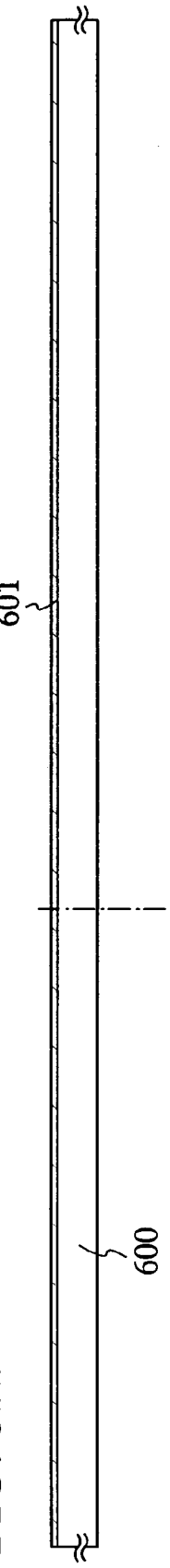
FIGS. 3A to 3C are diagrams each showing Embodiment 4.

First, a first barrier film 601 is deposited on a substrate 600 as shown in FIG. 3A.

As the substrate 600, a glass substrate, a quartz substrate, a ceramic substrate, and the like can be used. The first barrier film 601 may have either a single-layer structure or a multi-layer structure including one or more of a silicon oxide film, a silicon nitride film, and a silicon oxynitride film. The first barrier film 601 may be formed by sputtering or CVD.

In this embodiment, a silicon nitride film is formed to have a thickness of 100 nm by sputtering. For the sputtering, silicon is used as a target, and the sputtering gas of $N_2$ and Ar with the gas flow rate of 20:20 (sccm) is employed. The deposition pressure of 0.4 Pa, the deposition power of 800 W, and a circular target with a radius of 6 inches are used for the deposition. The deposition temperature ranges from room temperature to 200° C. In this embodiment, the film is deposited at 200° C.

Then, a plurality of TFTs are formed on the first barrier film 601. It is to be noted that all the TFTs for the pixel portion and the driver circuit portion are formed at the same time here.

It is to be noted that TFT herein defined may be any TFT formed by known methods and having known structures, therefore, the invention is not limited to a specific TFT.

Figure 3B:
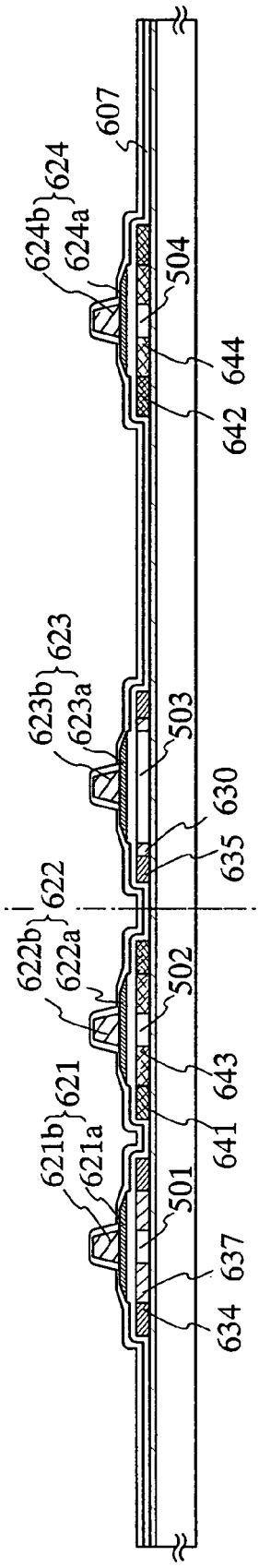

A structure of the TFT according to the invention is as shown in FIG. 3B. First, a semiconductor film (amorphous silicon film here) having an amorphous structure is formed, and it is, after undergoing crystallization by a known crystallization technique such as solid phase growth and laser crystallization to obtain a crystalline structure, patterned to form a semiconductor layer isolated in island shapes.

Then, a gate insulating film 607 is deposited to have a thickness of 40 nm to 150 nm using an insulating film including silicon by plasma CVD so as to cover the semiconductor layer.

Over the gate insulating film 607, a first conductive film having a thickness of 20 nm to 100 nm and a second conductive film having a thickness of 100 nm to 400 nm are sequentially deposited in this order. As a material for each of the first and second conductive films, elements selected from the group including Ta, W, Ti, Mo, Al, Cu, or an alloy material or a compound material having one of these elements as its main component can be used. In this embodiment, a tantalum nitride film having a thickness of 30 nm as a first conductive film and a tungsten film having a thickness of 370 nm as a second conductive film are sequentially deposited in this order.

Then, the first and second conductive films are sequentially etched to form gate electrodes of TFTs (621 to 624). It is to be noted that these gate electrodes (621 to 624) each have laminate structures of first conductive layers (621a to 624a) and second conductive layers (621b to 624b).

Next, by doping impurities into the previously formed semiconductor layers, impurity regions (source region and drain region) are formed. It is to be noted that as for the impurity elements that impart P-type conductivity to semiconductors, elements that belong to the 13th group of a periodic table such as boron (B), alminium (Al), gallium (Ga) are known. In addition, as for the impurity elements that impart N-type conductivity to semiconductors, elements that belong to the 15th group of a periodic table such as phosphorus (P) or arsenic (As) are known.

To a first impurity region 630, impurity elements that impart N-type conductivity are doped in the concentration range of $1\times10^{16}/cm^3$ to $1\times10^{17}/cm^3$. Here, the region having the same concentration range as the first impurity region 630 is also referred to as an n$^{--}$region.

To second impurity regions 634 and 635, impurity elements that impart N-type conductivity are doped in the concentration range of $1\times10^{20}/cm^3$ to $1\times10^{21}/cm^3$. Here, the region having the same concentration range as the second impurity regions 634 and 635 is also referred to as an n$^+$ region.

To a third impurity region 637, impurity elements that impart N-type conductivity are doped in the concentration range of $1\times10^{18}/cm^3$ to $1\times10^{19}/cm^3$. Here, the region having the same concentration range as the third impurity region 637 is also referred to as an n$^-$ region.

To fourth impurity regions 641 and 642, impurity elements that impart P-type conductivity are doped in the concentration range of $1\times10^{20}/cm^3$ to $1\times10^{21}/cm^3$. Here, the region having the same concentration range as the fourth impurity regions 641 and 642 are also referred to as a p$^+$ region.

To fifth impurity regions 643 and 644, impurity elements that impart P-type conductivity are doped in the concentration range of $1\times10^{18}/cm^3$ to $1\times10^{20}/cm^3$. Here, the region having the same concentration range as the fifth impurity regions 643 and 644 are also referred to as a p$^-$ region.

It is to be noted that each part of semiconductor layers (501 to 504) that is not an impurity region is to be referred to as a channel forming region.

Figure 3C:
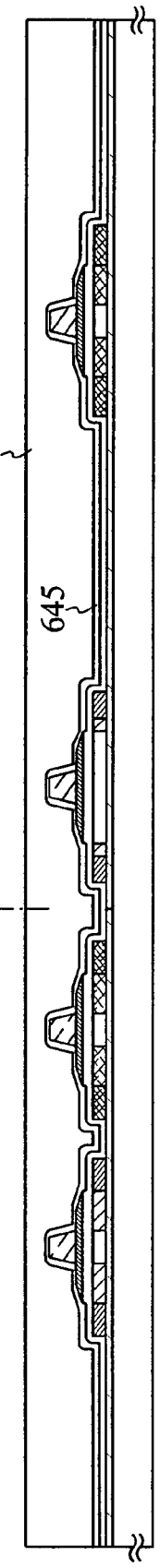

After forming the TFTs as described above, an insulating film is formed so as to cover the TFT as shown in FIG. 3C. In this embodiment, an insulating film including an inorganic material is referred to as a first interlayer insulating film 645. Specifically, a silicon nitride film is formed to have a thickness of 100 nm by plasma CVD. It is needless to mention that the insulating film is not limited to silicon nitride film, and alternative insulating films having a single-layer structure or multi-layer structure including silicon may be employed as well.

Next, a second interlayer insulating film 646 formed of an organic insulating material is formed on the first interlayer insulating film 645. In this embodiment, a film is deposited by acrylic coating to have a thickness of 1.0 μm to 2.0 μm.

By forming the second interlayer insulating film 646 with an organic material in this manner, the surface thereof can be efficiently leveled off. In addition, since an organic material generally has a low dielectric constant, parasitic capacitance can be reduced. However, it is not suited for a protective film in view of its hygroscopic property, therefore, it may be combined with a silicon oxide film, a silicon oxynitride film, a silicon nitride film, or the like which is formed as the first interlayer insulating film 645 as shown in this embodiment.

Figure 4A:
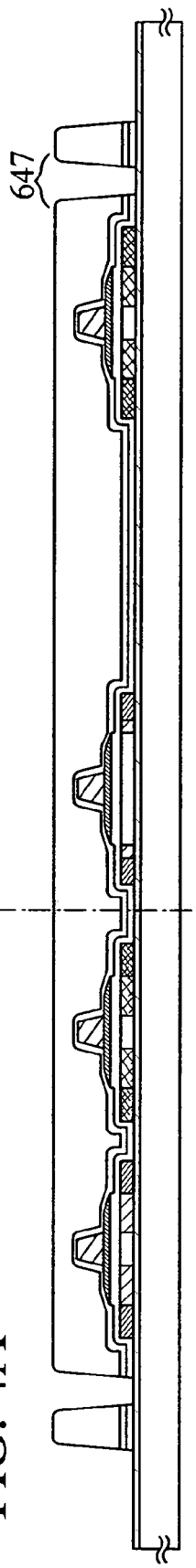
FIGS. 4A to 4C are diagrams each showing Embodiment 4.

Then, as shown in FIG. 4A, a first opening 647 is formed by etching a part of the second interlayer insulating film 646, the first interlayer insulating film 645, and the gate insulating film 607.

First of all, the second interlayer insulating film 646 is etched. Here, the second interlayer insulating film 646 is etched with material gas of $CF_4$, $O_2$, and He.

Then, the first interlayer insulating film 645 is etched. Here, the first interlayer insulating film 645 is etched by using material gas of $CF_4$, $O_2$, and He as the first condition, and by using material gas of $CHF_3$ as the second condition.

Then, etching is performed on the gate insulating film 607 as well. In this case, the gate insulating film 607 is etched by using material gas of $CHF_3$. In this manner, the first opening 647 is formed.

It is to be noted that as for the fabrication of the first opening 647, not only the etching as described above, but also ink-jet can be employed, in which etchant is applied to the desired place to form the first opening 647 thereon.

Further, as an alternative method for forming the first opening 647, instead of etching, ink-jet in which each of the previously formed gate insulating film 607, the first interlayer insulating film 645, and the second interlayer insulating film 646 is formed on the desired place by using application liquid including an insulating material (for example, an inorganic material (a liquid solution in which silicon oxide, silicon nitride, silicon oxynitride, or the like is dissipated into a solvent), or a photosensitive or non-photosensitive organic material (polyimide, acrylic, polyamide, polyimide amide, resist, benzocyclobutene, SOG, or the like)) can be employed, thereby omitting patterning steps using the above-mentioned etching.

Figure 4B:
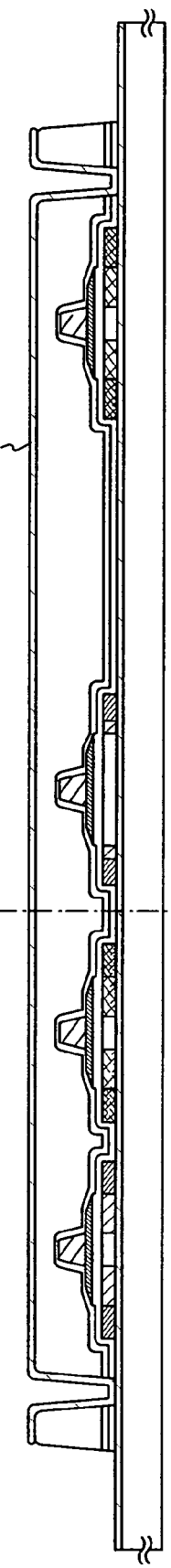

Next, a second barrier film 648 as shown in FIG. 4B is deposited. The second barrier film 648 may have either a single-layer structure or a multi-layer structure including one or more of a silicon oxide film, a silicon nitride film, and a silicon oxynitride film. The second barrier film 648 may be formed by sputtering or CVD. In this embodiment, a silicon nitride film is formed to have a thickness of 100 nm by sputtering.

Next, contact holes are formed so as to reach the source region or the drain region of the TFT. It is to be noted that the contact holes are formed by dry etching each of the second barrier film 648, the second interlayer insulating film 646, the first interlayer insulating film 645, and the gate insulating film 607 under the following condition.

First of all, the second barrier film 648 is etched. Here, the second barrier film 648 is etched with material gas of $CF_4$, $O_2$, and He.

Then, etching is sequentially performed on the second interlayer insulating film 646, the first interlayer insulating film 645, and the gate insulating film 607. The etching condition for this case may be similar to the previous etching condition of the second interlayer insulating film 646, the first interlayer insulating film 645, and the gate insulating film 607, therefore, it is omitted herein.

Figure 4C:
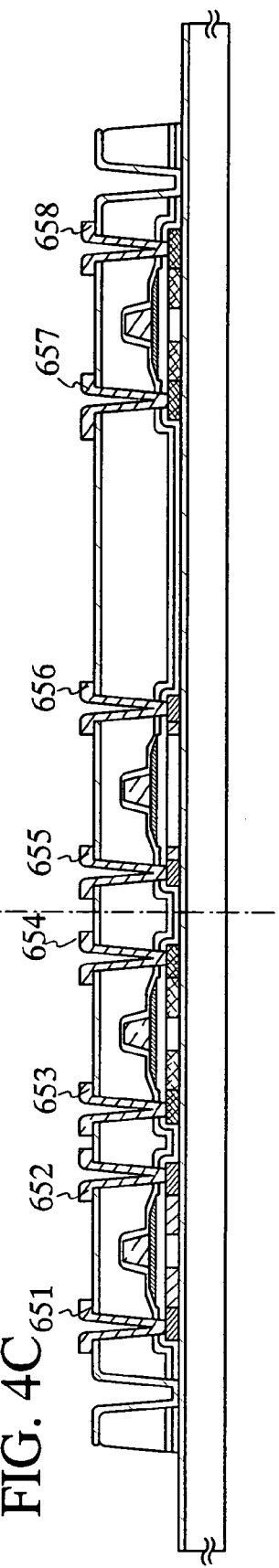

Subsequently, wirings are formed by using Al, Ti, Mo, W, and the like. As for the material for these electrodes and pixel electrodes, it is preferable to use a material having high reflexivity such as a film including Al or Ag as its main component, or these laminated films. In this manner, wirings 651 to 658 are formed (FIG. 4C).

Next, a third interlayer insulating film 660 including an organic insulating material is deposited. In this embodiment, it is formed to have a thickness of 1.0 μm to 5.0 μm by acrylic coating.

Then, as shown in FIG. 5A, a second opening 661 is formed by etching a part of the third interlayer insulating film 660, the second barrier film 648, the second interlayer insulating film 646, the first interlayer insulating film 645, and the gate insulating film 607.

First of all, the third interlayer insulating film 660 is etched. Here, the third interlayer insulating film 660 is etched with material gas of $CF_4$, $O_2$, and He.

Then, etching is sequentially performed on the second barrier film 648, the second interlayer insulating film 646, the first interlayer insulating film 645, and the gate insulating film 607. The etching condition for this case may be similar to the previous etching condition of the second barrier film 648, the second interlayer insulating film 646, the first interlayer insulating film 645, and the gate insulating film 607, therefore, it is omitted herein.

It is to be noted that as for the fabrication of the second opening 661, not only the etching as described above, but also ink-jet can be employed, in which etchant is applied to the desired place to form the second opening 661 thereon.

Further, as an alternative method for forming the second opening 661, instead of etching, ink-jet in which each of the previously formed gate insulating film 607, the first interlayer insulating film 645, the second interlayer insulating film 646, and the third interlayer insulating film 660 is formed on the desired place by using application liquid including an insulating material (for example, an inorganic material (a liquid solution in which silicon oxide, silicon nitride, silicon oxynitride or the like is dissipated into a solvent), or a photosensitive or non-photosensitive organic material (polyimide, acrylic, polyamide, polyimide amide, resist, benzocyclobutene, SOG, or the like)) can be employed, thereby omitting patterning steps using the above-mentioned etching.

Then, a third barrier film 662 is deposited as shown in FIG. 5B. The third barrier film 662 may have either a single-layer structure or a multi-layer structure including one or more of a silicon oxide film, a silicon nitride film, and a silicon oxynitride film. The third barrier film 662 may be formed by sputtering or CVD. In this embodiment, a silicon nitride film is formed to have a thickness of 100 nm by sputtering.

Next, a third opening 663 is formed so as to reach a part of the wiring of the TFT. It is to be noted that the third opening 663 is formed by dry etching each of the third barrier film 662 and the third interlayer insulating film 660 under the following condition.

First of all, the third barrier film 662 is etched. Here, the third barrier film 662 is etched with material gas of $CF_4$, $O_2$, and He.

Next, etching is sequentially performed on the third interlayer insulating film 660. The etching condition for this case may be similar to the previous etching condition of the third interlayer insulating film 660, therefore, it is omitted herein.

Then, a transparent conductive film having transmittancy is deposited on the third barrier film 662. As a material to form the transparent conductive film, indium tin oxide (ITO), or indium zinc oxide (IZO) in which 2% to 20% of zinc oxide (ZnO) is mixed with indium oxide may be used. In this embodiment, the transparent conductive film with ITO is formed to have a thickness of 110 nm by sputtering.

Then, after forming a mask comprising resist on the transparent conductive film comprising ITO, it is applied wet etching with acid etchant, thereby forming a first electrode 664 (FIG. 5C).

Subsequently, an insulating layer 665 comprising an organic material is deposited. Specifically, it is formed to have a thickness of 1.45 μm by spin coating using photosensitive acrylic, and patterned by photolithography. Then, etching is performed on its overlapped portion with the first electrode (anode) 644 and on the third barrier film 662 in an edge of the substrate so as to form fourth openings 670 and 671, thereby completing the insulating layer 665 (FIG. 6A).

It is to be noted that as an etching condition for this case, $CF_4$, $O_2$, and He are used as the material gas.

It is also to be noted that as for the fabrication of the fourth openings 670 and 671, not only the etching as described above, but also ink-jet can be employed, in which etchant is applied to the desired place to form the fourth openings 670 and 671 thereon.

Further, as an alternative method for forming the fourth openings 670 and 671, instead of etching, ink-jet in which the previously formed insulating layer 665 is formed in the desired place by using application liquid including an insulating material (for example, an inorganic material (a liquid solution in which silicon oxide, silicon nitride, silicon oxynitride or the like is dissipated into a solvent), or a photosensitive or non-photosensitive organic material (polyimide, acrylic, polyamide, polyimide amide, resist, benzocyclobutene, SOG, or the like)) can be employed, thereby omitting patterning steps using the above-mentioned etching.

Next, a light emitting layer 666 is deposited on the first electrode (anode) 664 that is exposed in the opening of the insulating layer 665. It is to be noted that the light emitting layer 666 at least comprises a light emitting layer, and formed in a laminate structure including one or more of a hole injection layer, a hole transporting layer, a blocking layer, an electron transporting layer, and an electron injection layer, each of which has a different function to carriers.

As for the material to form the light emitting layer 666, either a known low molecular weight or a high molecular weight organic compound may be used.

Specifically, the following materials can be used to form the light emitting layer 666.

For the hole injection material for forming the hole injection layer, within the framework of organic compounds, porphyrin compounds are effective, such as phthalocyanine (hereinafter referred to as $H_2$—Pc), and copper phthalocyanine (hereinafter referred to as Cu—Pc). In addition, materials obtained by performing chemical doping on conductive high molecular weight compounds are also effective, such as polyethylene dioxythiophene (hereinafter referred to as PEDOT) doped with polystyrene sulfonate (hereinafter referred to as PSS), polyaniline, and polyvinylcarbazole (hereinafter referred to as PVK).

For the hole transporting material for forming the hole transporting layer, aromatic amine compounds (namely, those having benzene ring-nitrogen bonds) are suitable. Such materials that are widely used include: in addition to triphenyldiamine (hereinafter referred to as TPD), its derivative of 4,4'-bis[N-(1-naphthyl)-N-phenyl-amino]-biphenyl (hereinafter referred to as a-NPD), starburst type aromatic amine compounds such as 4,4',4"-tris(N,N-diphenyl-amino)-triphenylamine (hereinafter referred to as TDATA), and 4,4',4"-tris[N-(3-methylphenyl)-N-phenyl-amino]-triphenylamine (hereinafter referred to as MTDATA).

For the light emitting material for forming the light emitting layer, various fluorescent pigments as well as metal complexes are effective, such as tris(8-quinolinolato)aluminum (hereinafter referred to as $Alq_3$), tris(4-methyl-8-quinolinolato)aluminum (hereinafter referred to as $Almq_3$), bis (10-hydroxybenzo[h]-quinolinato)beryllium (hereinafter referred to as $BeBq_2$), bis(2-methyl-8-quinolinolate)-(4-hydroxy-biphenylyl)-aluminum (hereinafter referred to as BAlq), bis[2-(2-hydroxyphenyl)-benzoxazolato]zinc (hereinafter referred to as $Zn(BOX)_2$), and bis[2-(2-hydroxyphenyl)-benzoothiazolato]zinc (hereinafter referred to as $Zn(BTZ)_2$). In addition, triplet light emitting materials in which metal complexes including platinum or iridium as a central metal can also be used. The triplet light emitting materials include: tris(2-phenylpyridine)iridium (hereinafter referred to as $Ir(ppy)_3$), 2,3,7,8,12,13,17,18-octaethyl-21H, 23H-porphyrin-platinum (hereinafter referred to as PtOEP), and the like.

For the electron transporting material for forming the electron transporting layer, metal complexes are frequently used, and metal complexes having quinoline skeleton or benzoquinoline skeleton such as the aforementioned $Alq_3$, $Almq_3$, and $BeBq_2$, and BAlq serving as a mixed ligand complex are suitable. Metal complexes having oxazole-based ligands or thiazole-based ligands such as $Zn(BOX)_2$ and $Zn(BTZ)_2$ are also suitable. Furthermore, other than metal complexes, oxadiazole derivatives such as 2-(4-biphenylyl)-5-(4-tert-buthylphenyl)-1,3,4-oxadiazole (hereinafter referred to as PBD) and 1,3-bis [5-(p-tert-butylphenyl)-1,3, 4-oxadiazole-2-yl]benzene (hereinafter referred to as OXD-7), triazole derivatives such as 3-(4-tert-butylphenyl)-4-phenyl-5-(4-biphenylyl)-1,2,4-triazole (hereinafter referred to as TAZ), and 3-(4-tert-butylphenyl)-4-(4-ethylphenyl)-5-(4-biphenylyl)-1,2,4-triazole (hereinafter referred to as p-EtTAZ), and phenanthroline derivatives such as bathophenanthroline (hereinafter referred to as BPhen) and bathocuproine (hereinafter referred to as BCP) can be used for the electron transporting material.

Incidentally, as for the blocking layer, the aforementioned BAlq, OXD-7, TAZ, p-EtTAZ, BPhen, BCP, or the like can be used since they have high excitation energy.

By combining the aforementioned materials, the light emitting layer 666 can be formed on the first electrode (anode) 664.

Next, a second electrode (cathode) 667 is deposited so as to cover the light emitting layer 666 as shown in FIG. 6B. In this embodiment, the second electrode (cathode) 667 is formed by laminating a cathode buffer layer comprising calcium fluoride ($CaF_2$) or barium fluoride ($BaF_2$) that is formed to be in contact with the light emitting layer 666 and a conductive film comprising aluminium. Specifically, the cathode buffer layer is formed to have a thickness of 1 nm by using calcium fluoride, and the conductive film is formed to have a thickness of 100 nm by using aluminium to complete the second electrode (cathode) 667.

As for the cathode material for forming the second electrode 667, known materials can be used as long as they have a small work function.

Further, a fourth barrier film 669 is deposited on the second electrode 667. The fourth barrier film 669 may have either a single-layer structure or a multi-layer structure including one or more of a silicon oxide film, a silicon nitride film, and a silicon oxynitride film. The fourth barrier film 669 may be formed by sputtering or CVD. In this embodiment, a silicon nitride film is formed to have a thickness of 100 nm by sputtering.

In this manner, a driver circuit 705 including an N-channel TFT 701 and a P-channel TFT 702, and a pixel portion 706 including an N-channel switching TFT 703 and a P-channel current controlling TFT 704 can be integrally formed over the same substrate. Further, according to the above structure, moisture and oxygen can be blocked from outside (in the horizontal direction in particular), which serves for the enhanced reliability of a light emitting device. Further, since a signal processing circuit is formed in the dead space beside the FPC, the device can be downsized and the wirings which are connected to the signal processing circuit are prevented from coming across the sealant and the sealed portion, which makes it possible to reduce moisture and oxygen entering from the connected portion of the sealant, the sealed portion and the wirings, and further enhances the reliability. This embodiment can be freely combined with embodiment mode and Embodiments 1 to 3.

Embodiment 5

Described in this embodiment are various electronic apparatuses using the light emitting device comprising light emitting elements of the invention.

Electronic apparatuses using the light emitting device of the invention include a video camera, a digital camera, a goggle type display (head mounted display), a navigation system, an audio reproduction device (car audio, audio component, and the like), a notebook personal computer, a game machine, a portable information terminal (a mobile computer, a mobile phone, a portable game machine, an electronic book, and the like), an image reproduction device provided with a recording medium (specifically, a device equipped with a display capable of reproducing the recording medium such as a Digital Versatile Disk (DVD), etc. and displaying the image thereof), and the like. Specific examples of these electronic apparatuses are shown in FIGS. 10A to 10G.

Figure 10A:
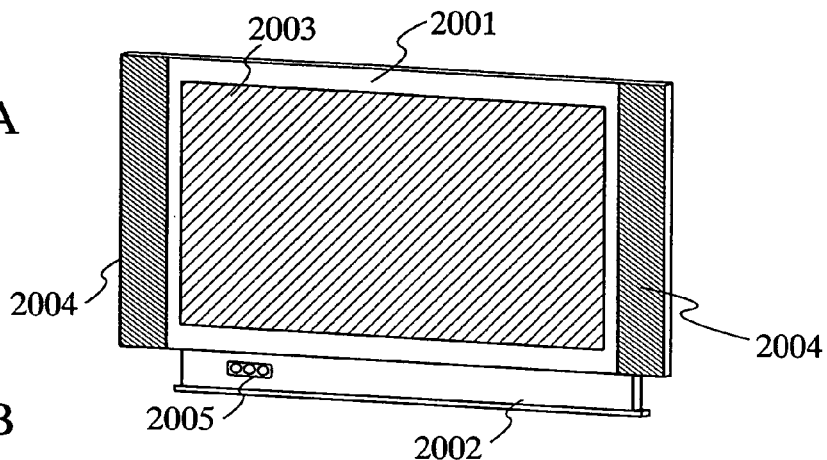
FIGS. 10A to 10G are views each showing Embodiment 5.

FIG. 10A illustrates a display device which includes a case 2001, a support base 2002, a display portion 2003, a speaker portion 2004, a video input terminal 2005, and the like. The light emitting device of the invention can be applied to the display portion 2003. Note that the display device includes all the information display devices for personal computers, television broadcast reception, advertisement, and the like.

Figure 10B:
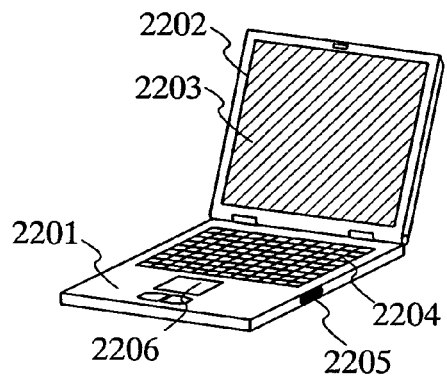

FIG. 10B illustrates a notebook personal computer which includes a body 2201, a case 2202, a display portion 2203, a key board 2204, an external connection port 2205, a pointing mouse 2206, and the like. The light emitting device of the invention can be applied to the display portion 2203.

Figure 10C:
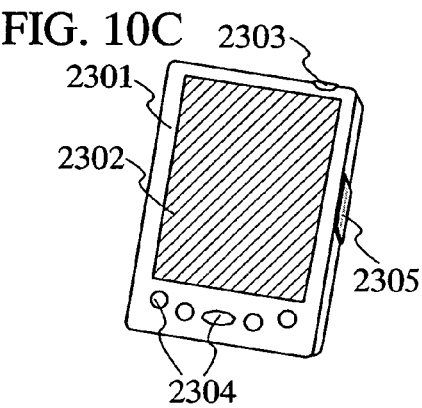

FIG. 10C illustrates a mobile computer which includes a body 2301, a display portion 2302, a switch 2303, operating keys 2304, an infrared port 2305, and the like. The light emitting device of the invention can be applied to the display portion 2302.

Figure 10D:
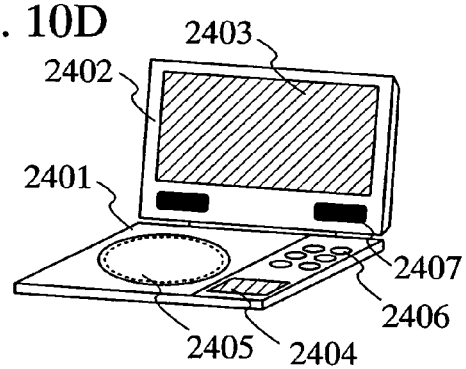

FIG. 10D illustrates a portable image reproduction device provided with a recording medium (specifically, a DVD reproduction device) which includes a body 2401, a case 2402, a display portion A 2403, a display portion B 2404, a recording medium (such as DVD) read-in portion 2405, operating keys 2406, a speaker portion 2407, and the like. The display portion A 2404 mainly displays image data whereas the display portion B 2404 mainly displays text data. The light emitting device of the invention can be applied to the display portions A 2403 and B 2404. Note that image reproduction device provided with a recording medium includes game machines for domestic use and the like.

Figure 10E:
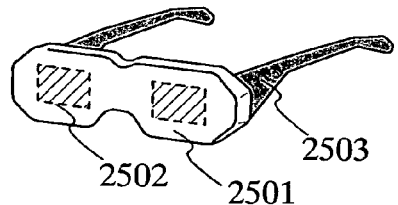

FIG. 10E illustrates a goggle type display (head mounted display) which includes a body 2501, a display portion 2502, an arm portion 2503, and the like. The light emitting device of the invention can be applied to the display portion 2502.

Figure 10F:
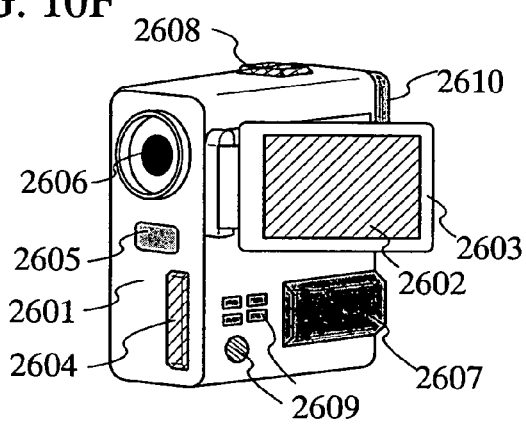

FIG. 10F illustrates a video camera which includes a body 2601, a display portion 2602, a case 2603, an external connection port 2604, a remote control receiving portion 2605, an image receiving portion 2606, a battery 2607, an audio input portion 2608, operating keys 2609, an eyepiece portion 2610, and the like. The light emitting device of the invention can be applied to the display portion 2602.

Figure 10G:
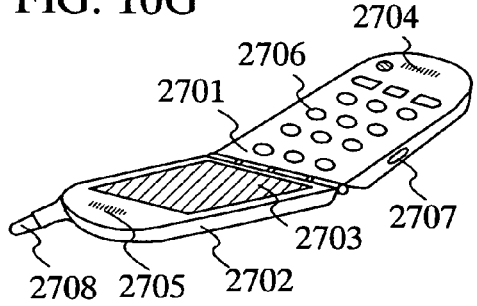
Figure 11A:
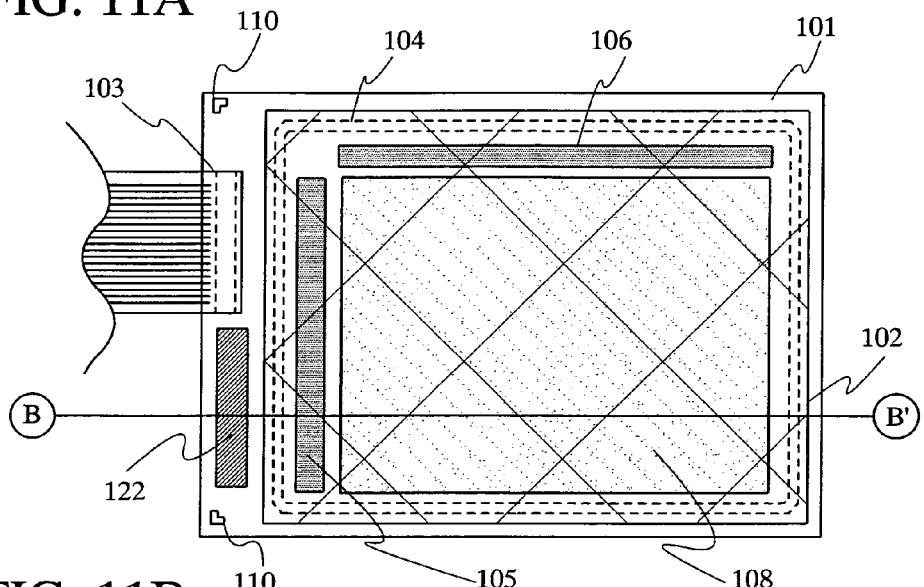
FIGS. 11A-11C are diagrams each showing embodiment mode.
Figure 11B:
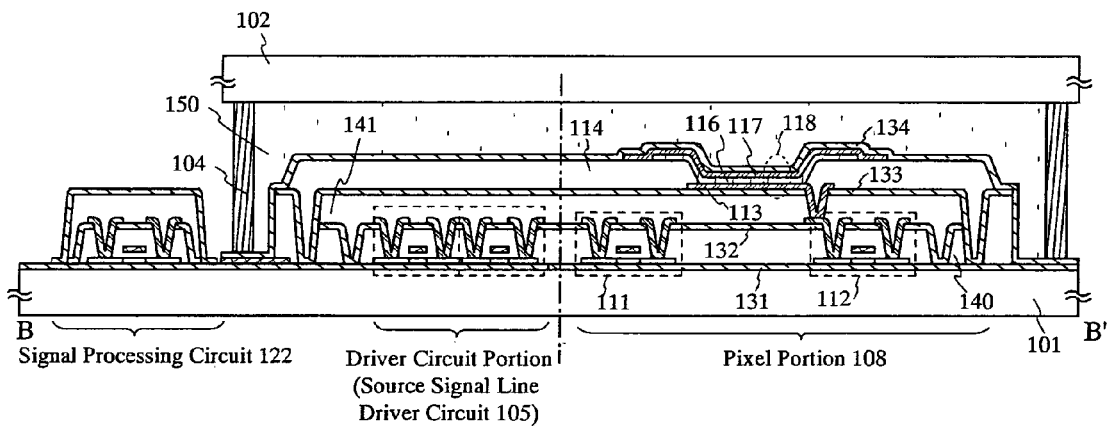
Figure 11C:
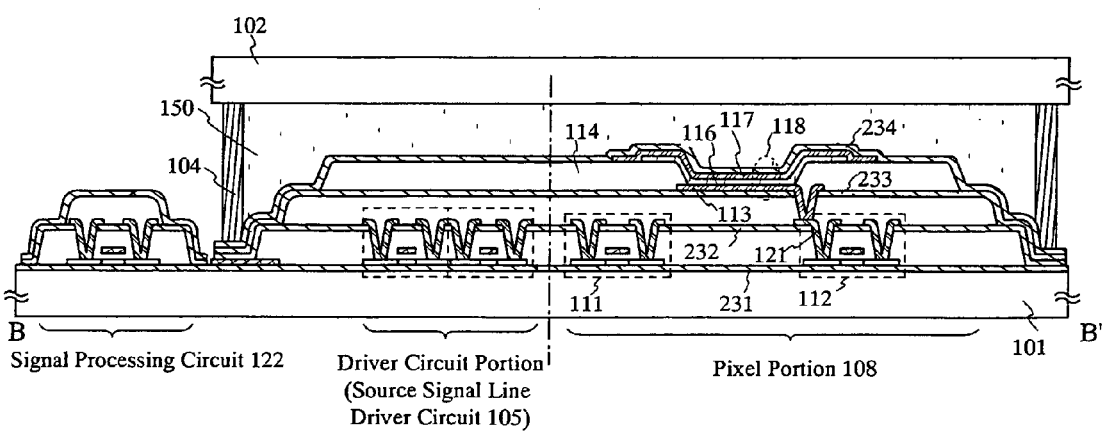

FIG. 10G illustrates a mobile phone which includes a body 2701, a case 2702, a display portion 2703, an audio input portion 2704, an audio output portion 2705, an operating key 2706, an external connection port 2707, an antenna 2708, and the like. The light emitting device of the invention can be applied to the display portion 2703.

This application is based on Japanese Patent Application serial NO. 2003-144190 filed in Japan Patent Office on 21th, May, 2003, the contents of which are hereby incorporated by reference.

Although the invention has been fully described by way of Embodiment Mode and Embodiments with reference to the accompanying drawings, it is to be understood that various changes and modifications will be apparent to those skilled in the art. Therefore, unless such changes and modifications depart from the scope of the invention hereinafter defined, they should be constructed as being included therein.

What is claimed is:

1. A light emitting device comprising:
   a substrate;
   a wiring connection portion over the substrate;
   a signal processing circuit over the substrate;
   a first barrier film over the substrate;
   a thin film transistor forming layer formed over the first barrier film;
   a second barrier film formed over the thin film transistor forming layer;
   a wiring forming layer formed over the second barrier film;
   a third barrier film formed over the wiring forming layer;
   a light emitting element forming layer formed over the third barrier film; and
   a fourth barrier film formed over the light emitting element forming layer,
   wherein the second barrier film is in contact with the first barrier film in a first opening formed in a part of the thin film transistor forming layer;
   wherein the signal processing circuit comprises a thin film transistor;
   wherein the wiring connection portion and at least a part of the signal processing circuit are located beside a same edge of the substrate; and
   wherein the signal processing circuit is formed in the exterior of an area in which the second barrier film is in contact with the first barrier film.

2. The light emitting device according to claim 1,
   wherein the first barrier film is in contact with the third barrier film in a second opening which is formed in each of the thin film transistor forming layer, the second barrier film and the wiring forming layer;

wherein the thin film transistor forming layer is provided in a space between the first barrier film and the third barrier film; and wherein the signal processing circuit is formed in the exterior of the area in which the third barrier film is in contact with the first barrier film over the substrate.

3. The light emitting device according to claim 1, wherein the fourth barrier film is in contact with the third barrier film;

wherein the light emitting element forming layer is sandwiched between the third barrier film and the fourth barrier film; and wherein the signal processing circuit is formed in the exterior of the area in which the third barrier film is in contact with the first barrier film over the substrate.

4. The light emitting device according to claim 1, wherein each of the first barrier film, the second barrier film, the third barrier film, and the fourth barrier film includes one or more of a silicon nitride film, a silicon nitride oxide film, and a nitrogen containing carbon film.

5. An electronic apparatus using the light emitting device according to claim 1, wherein said electronic apparatus is selected from the group consisting of a video camera, a digital camera, a goggle type display, a navigation system, an audio reproduction device, a notebook personal computer, a game machine, a portable information terminal, and an image reproduction device.

6. A light emitting device comprising:

a substrate;

a wiring connection portion over the substrate;

a signal processing circuit over the substrate;

a first barrier film over the substrate;

a thin film transistor forming layer formed over the first barrier film;

a second barrier film formed over the thin film transistor forming layer;

a wiring forming layer formed over the second barrier film;

a third barrier film formed over the wiring forming layer;

a light emitting element forming layer formed over the third barrier film; and a fourth barrier film formed over the light emitting element forming layer, wherein the thin film transistor forming layer is surrounded with the first barrier film and the second barrier film;

wherein the signal processing circuit comprises a thin film transistor;

wherein the wiring connection portion and at least a part of the signal processing circuit are located beside a same edge of the substrate; and wherein the signal processing circuit is formed in the exterior of the area in which the second barrier film is in contact with the first barrier film over the substrate.

7. The light emitting device according to claim 6, wherein the wiring forming layer is surrounded with the second barrier film and the third barrier film;

wherein the light emitting element forming layer is surrounded with the third barrier film and the fourth barrier film; and wherein the signal processing circuit is formed in the exterior of the area in which the third barrier film is in contact with the first barrier film over the substrate.

8. The light emitting device according to claim 6, wherein each of the first barrier film, the second barrier film, the third barrier film, and the fourth barrier film includes one or more of a silicon nitride film, a silicon nitride oxide film, and a nitrogen containing carbon film.

9. An electronic apparatus using the light emitting device according to claim 6, wherein said electronic apparatus is selected from the group consisting of a video camera, a digital camera, a goggle type display, a navigation system, an audio reproduction device, a notebook personal computer, a game machine, a portable information terminal, and an image reproduction device.

* * * * *